(12) United States Patent
Honan et al.

(10) Patent No.: US 10,334,739 B1
(45) Date of Patent: Jun. 25, 2019

(54) PRINTING AN ELECTRICAL DEVICE USING FLEXOGRAPHIC PLATE WITH PROTECTIVE FEATURES

(71) Applicant: Eastman Kodak Company, Rochester, NY (US)

(72) Inventors: James S. Honan, Spencerport, NY (US); Eric K. Zeise, Pittsford, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/921,726

(22) Filed: Mar. 15, 2018

(51) Int. Cl.
| | |
|---|---|
| *B41N 1/12* | (2006.01) |
| *H05K 3/12* | (2006.01) |
| *C23C 18/38* | (2006.01) |
| *C23C 18/16* | (2006.01) |
| *H05K 3/18* | (2006.01) |
| *G06F 3/044* | (2006.01) |
| *B41F 5/24* | (2006.01) |
| *B05D 1/28* | (2006.01) |
| *B41C 1/05* | (2006.01) |
| *B05D 5/12* | (2006.01) |

(52) U.S. Cl.
CPC ............ *H05K 3/1275* (2013.01); *B41N 1/12* (2013.01); *C23C 18/1608* (2013.01); *C23C 18/38* (2013.01); *G06F 3/044* (2013.01); *H05K 3/1208* (2013.01); *H05K 3/181* (2013.01); *B05D 1/28* (2013.01); *B05D 5/12* (2013.01); *B41C 1/05* (2013.01); *B41F 5/24* (2013.01); *B41P 2200/12* (2013.01); *H05K 2203/0121* (2013.01); *H05K 2203/0143* (2013.01); *H05K 2203/072* (2013.01)

(58) Field of Classification Search
CPC .... H05K 3/1275; H05K 3/1208; H05K 3/181; H05K 2203/0121; H05K 2203/0143; H05K 2203/072; C23C 18/1608; C23C 18/38; B41P 2000/12; B41N 1/12; B05D 1/28; B05D 5/12
USPC ....................................................... 427/98.4
See application file for complete search history.

(56) References Cited

U.S. PATENT DOCUMENTS

| | | |
|---|---|---|
| 5,492,730 A | 2/1996 | Balaba et al. |
| 5,527,562 A | 6/1996 | Balaba et al. |

(Continued)

OTHER PUBLICATIONS

"New semiconductor inks for printed electronics in LCD and OLED displays," News Release from BASF, Feb. 29, 2016.

(Continued)

*Primary Examiner* — Brian K Talbot
(74) *Attorney, Agent, or Firm* — Kevin E. Spaulding

(57) ABSTRACT

A printed electrical device is formed using a flexographic printing system. A flexographic printing plate having a pattern of raised features includes an active region having a plurality of parallel traces separated by a trace spacing of between 5-40 microns that are used to form active microtraces that provide an electrical function, and an inactive region adjacent to the active region having one or more protective features that are used to form electrically-inactive features. The protective features are separated from an outermost trace of the plurality of traces by a gap distance of between 60% and 250% of the trace spacing. The flexographic printing plate is used to transfer ink from an anilox roller to a substrate to provide a printed pattern corresponding to the pattern of raised features on the flexographic printing plate.

20 Claims, 19 Drawing Sheets

(56) References Cited

U.S. PATENT DOCUMENTS

| | | |
|---|---|---|
| 5,719,009 A | 2/1998 | Fan |
| 5,798,202 A | 8/1998 | Cushner et al. |
| 5,804,353 A | 9/1998 | Cushner et al. |
| 6,090,529 A | 7/2000 | Gelbart |
| 6,159,659 A | 12/2000 | Gelbart |
| 6,511,784 B1 | 1/2003 | Hiller et al. |
| 7,799,504 B2 | 9/2010 | Zwadlo et al. |
| 7,811,744 B2 | 10/2010 | Figov |
| 7,947,426 B2 | 5/2011 | Figov et al. |
| 8,114,572 B2 | 2/2012 | Landry-Coltrain et al. |
| 8,142,987 B2 | 3/2012 | Ali et al. |
| 8,153,347 B2 | 4/2012 | Veres et al. |
| 8,187,793 B2 | 5/2012 | Regan et al. |
| 8,399,177 B2 | 3/2013 | Stolt et al. |
| 8,945,686 B2 | 2/2015 | Pope et al. |
| 9,063,426 B2 | 6/2015 | Ramakrishnan et al. |
| 9,067,402 B1 | 6/2015 | Bielak |
| 9,235,126 B1 * | 1/2016 | Bielak .................. G03F 7/2022 |
| 9,315,062 B2 | 4/2016 | Zwadlo |
| 2002/0136969 A1 | 9/2002 | Hiller et al. |
| 2003/0129530 A1 | 7/2003 | Leinenbach et al. |
| 2003/0136285 A1 | 7/2003 | Tesler et al. |
| 2003/0180636 A1 | 9/2003 | Kanga et al. |
| 2008/0233280 A1 | 9/2008 | Blanchet et al. |
| 2009/0076217 A1 | 3/2009 | Gommans et al. |
| 2012/0237871 A1 | 9/2012 | Zwadlo |
| 2012/0240802 A1 | 9/2012 | Landry-Coltrain et al. |
| 2014/0047992 A1 | 2/2014 | Ramakrishnan |
| 2014/0295063 A1 | 10/2014 | Petcavich et al. |
| 2014/0327452 A1 | 10/2014 | Tonouchi |
| 2014/0349013 A1 * | 11/2014 | Ramakrishnan .......... B05C 9/08 427/270 |
| 2015/0122138 A1 | 5/2015 | VanOstrand et al. |
| 2015/0202859 A1 * | 7/2015 | Fohrenkamm ......... B41M 3/008 101/395 |
| 2016/0168713 A1 | 6/2016 | Reuter et al. |
| 2017/0157966 A1 * | 6/2017 | Becker .................... B41M 1/04 |
| 2018/0141325 A1 * | 5/2018 | Kuramoto ................ B41C 1/05 |

OTHER PUBLICATIONS

S. Khan et al., "Technologies for Printing Sensors and Electronics Over Large Flexible Substrates: A Review," IEEE Sensors Journal, vol. 15, pp. 3164-3185 (2015).

\* cited by examiner

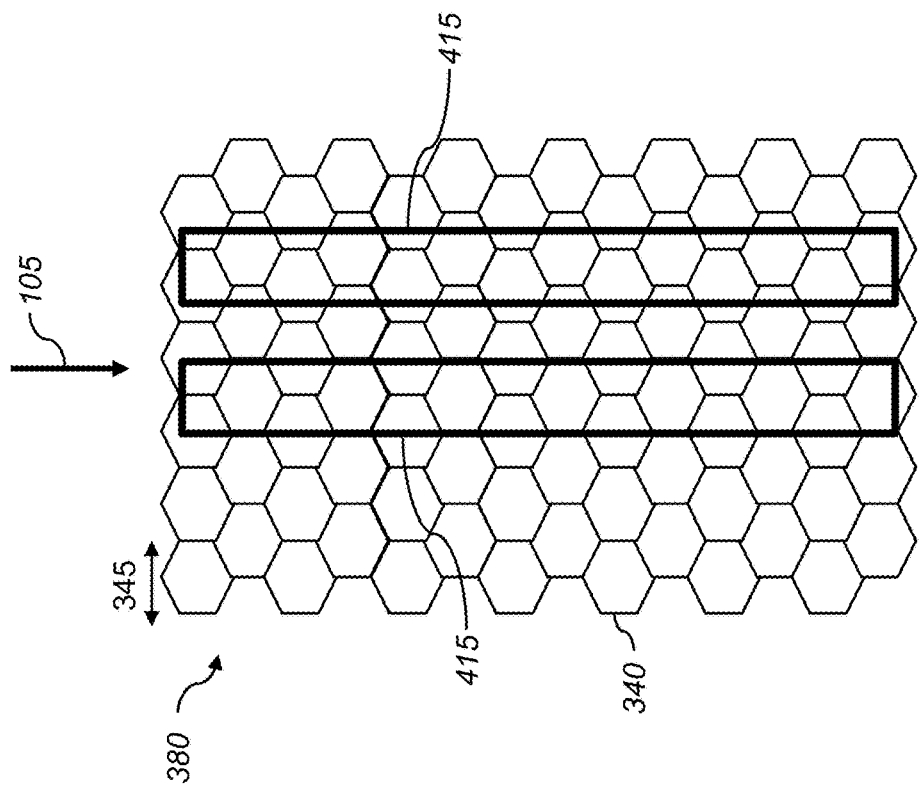
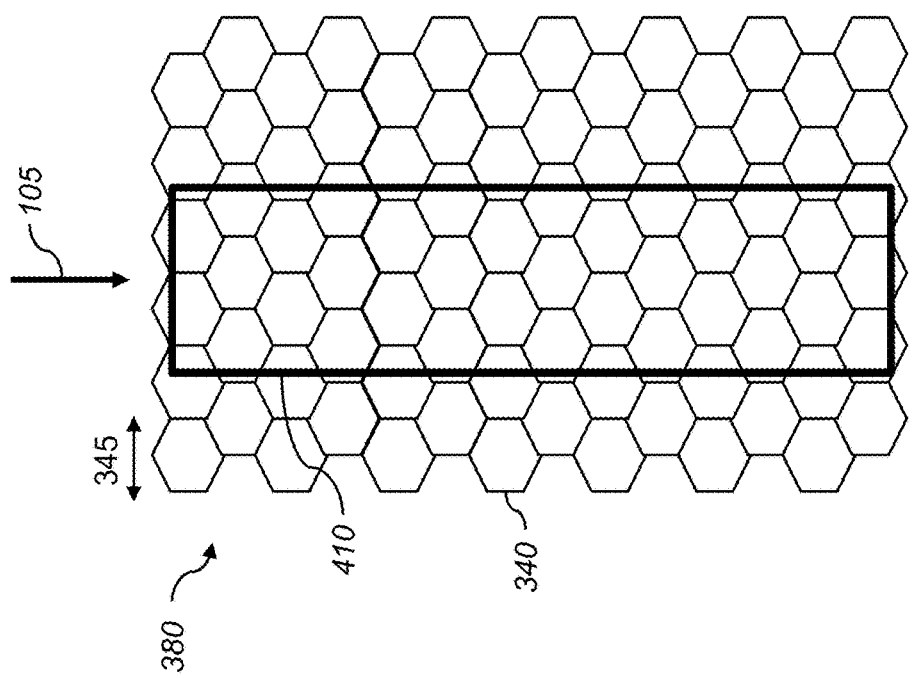

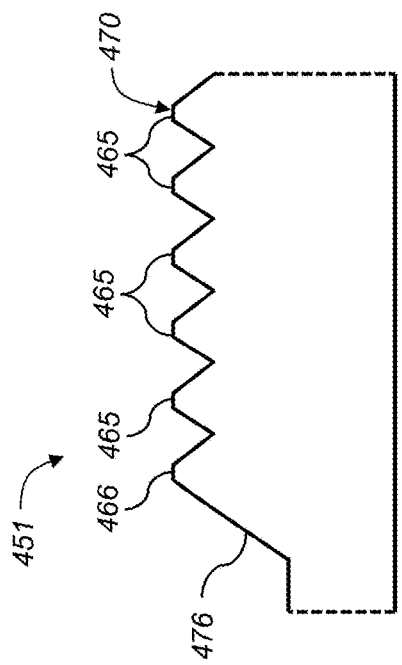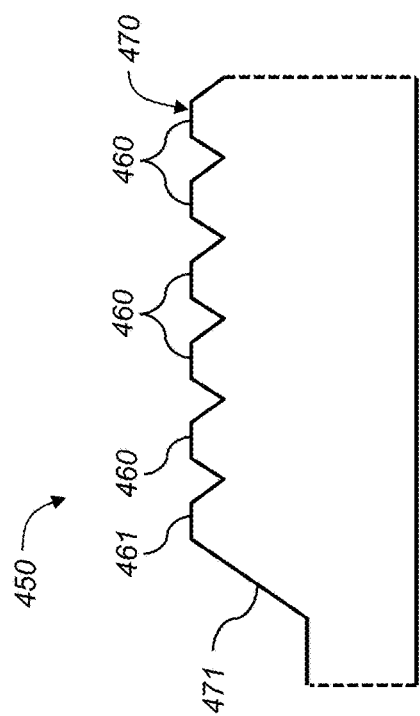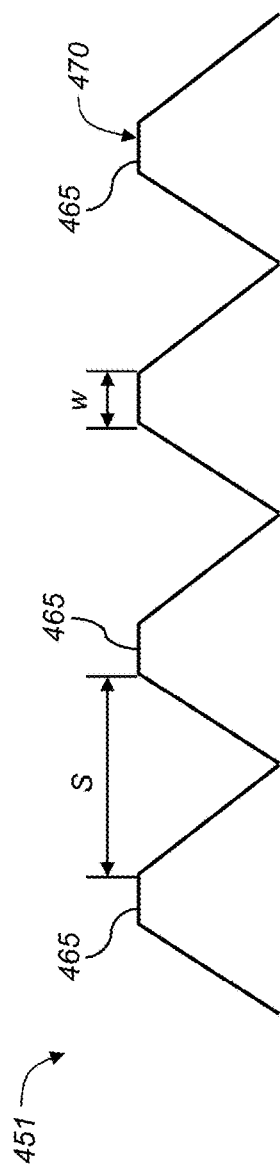
FIG. 6A
FIG. 6B
FIG. 6C

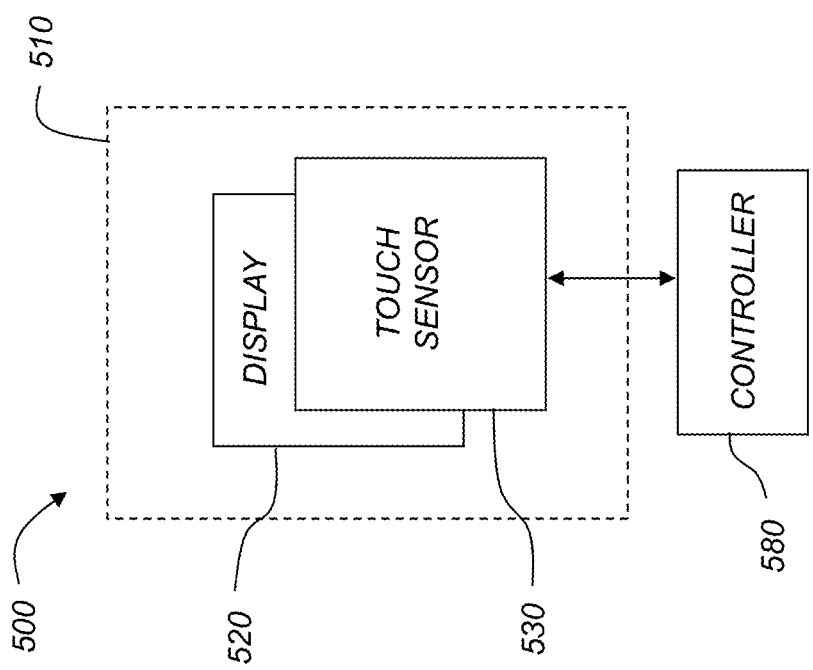

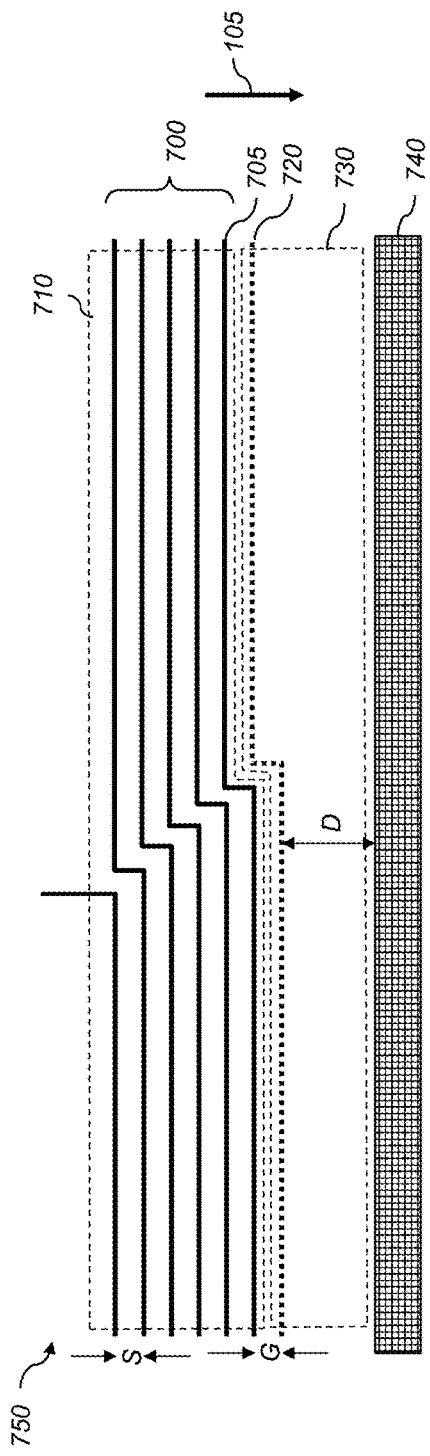
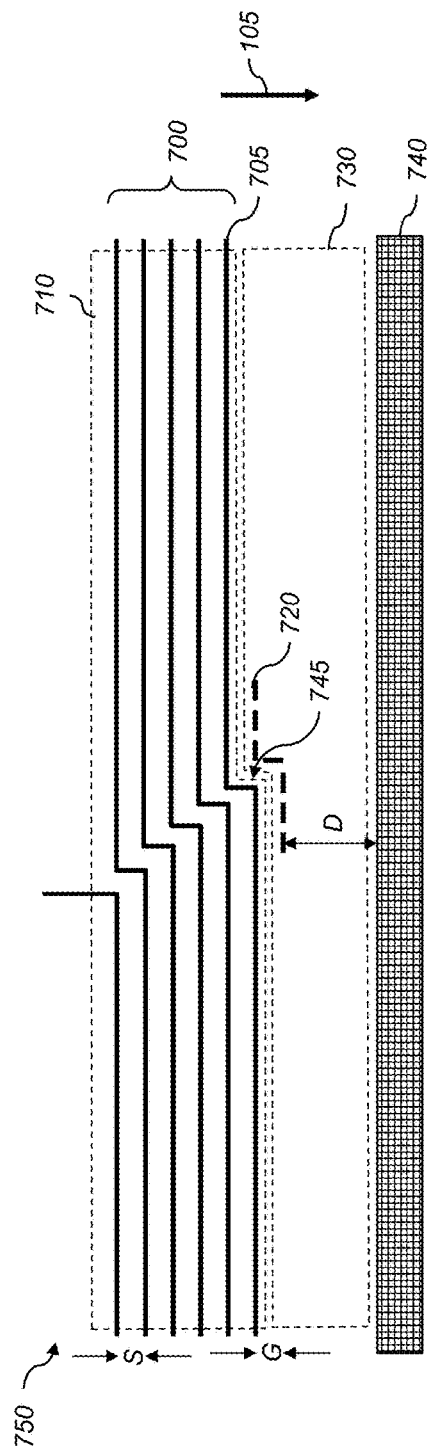

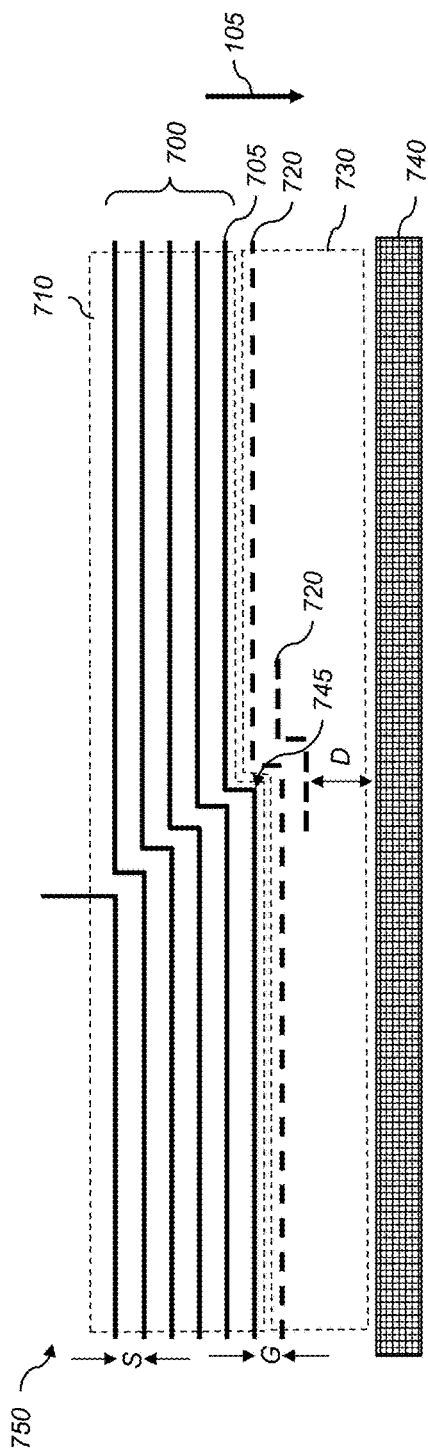
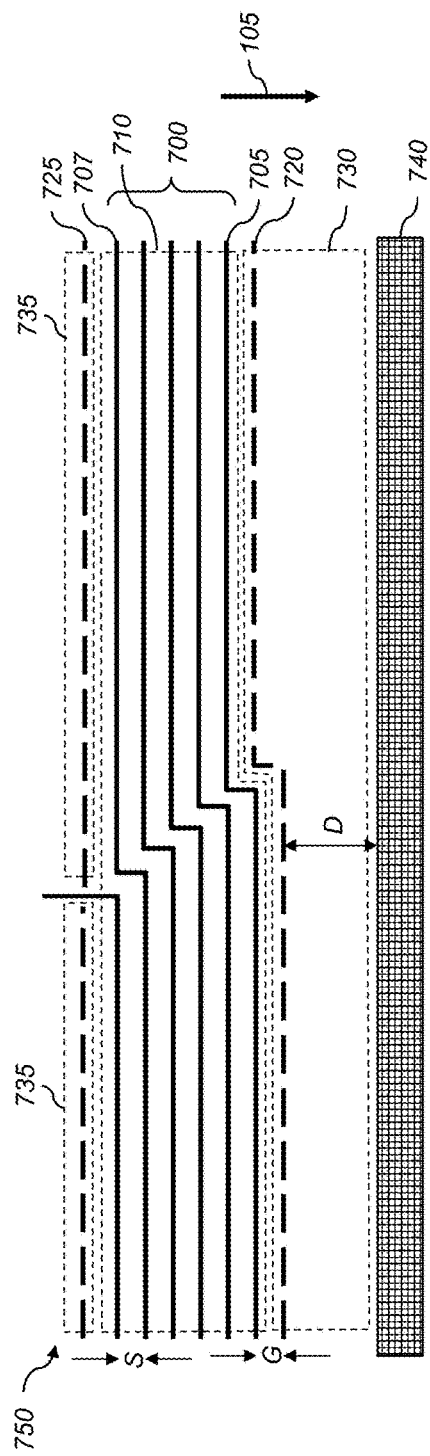
FIG. 13E
FIG. 13F

PRINTING AN ELECTRICAL DEVICE USING FLEXOGRAPHIC PLATE WITH PROTECTIVE FEATURES

FIELD OF THE INVENTION

This invention pertains to the field of electrical device fabrication, and more particularly to a method for forming a printed electrical device using a flexographic printing system.

BACKGROUND OF THE INVENTION

Processing a web of media in roll-to-roll fashion can be an advantageous and low-cost manufacturing approach for devices or other objects formed on the web of media. An example of a process that includes web transport through an additive printing system is roll-to-roll flexographic printing.

Co-planar wave guide circuits and touch screens are two examples of electrical devices that can be manufactured using a roll-to-roll additive flexographic printing process. For example, a capacitive touch screen includes a substantially transparent substrate which is provided with electrically conductive patterns that do not excessively impair the transparency—either because the conductors are made of a material, such as indium tin oxide, that is substantially transparent, or because the conductors are sufficiently narrow such that the transparency is provided by the comparatively large open areas not containing conductors. For capacitive touch screens having metallic conductors, it is advantageous for the features to be highly conductive but also very narrow. Capacitive touch screen sensor films are an example of an article having very fine features with improved electrical conductivity resulting from an additive printing system.

U.S. Patent Application Publication 2014/0295063 by Petcavich et al. discloses a method of manufacturing a capacitive touch sensor using a roll-to-roll process to print a conductor pattern on a flexible transparent dielectric substrate. A first conductor pattern is printed on a first side of the dielectric substrate using a first flexographic printing plate and is then cured. A second conductor pattern is printed on a second side of the dielectric substrate using a second flexographic printing plate and is then cured. The ink used to print the patterns includes a catalyst that acts as seed layer during a subsequent electroless plating process. The electrolessly-plated material (e.g., copper) provides the low resistivity in the narrow lines of the grid needed for excellent performance of the capacitive touch sensor. Petcavich et al. indicate that the line width of the flexographically-printed microwires can be 1 to 50 microns.

Flexography is a method of printing or pattern formation that is commonly used for high-volume printing runs. It is typically employed in a roll-to-roll format for printing on a variety of soft or easily deformed materials including, but not limited to, paper, paperboard stock, corrugated board, polymeric films, fabrics, metal foils, glass, glass-coated materials, flexible glass materials and laminates of multiple materials. Coarse surfaces and stretchable polymeric films are also economically printed using flexography.

Flexographic printing members are sometimes known as relief printing members, relief-containing printing plates, printing sleeves, or printing cylinders, and are provided with raised relief images (i.e., patterns of raised features) onto which ink is applied for application to a substrate. While the raised relief images are inked, the recessed relief "floor" should remain free of ink.

Although flexographic printing has conventionally been used in the past for the printing of images, more recent uses of flexographic printing have included functional printing of devices, such as touch screen sensor films, antennas, and other devices to be used in electronics or other industries. Such devices typically include electrically conductive patterns.

To improve the optical quality and reliability of the touch screen, it has been found to be preferable that the width of the grid lines be approximately 2 to 10 microns, and even more preferably to be 4 to 8 microns. In addition, in order to be compatible with high-volume roll-to-roll manufacturing processes, it is preferable for the roll of flexographically printed material to be electrolessly plated in a roll-to-roll electroless plating system. More conventionally, electroless plating is performed by immersing the item to be plated in a tank of plating solution. However, for high volume uniform plating of features on both sides of the web of substrate material, it is preferable to perform the electroless plating in a roll-to-roll electroless plating system.

Flexography is a form of rotary web letterpress, combining features of both letterpress and rotogravure printing, which uses relief plates comprised of flexible rubber or photopolymer plates and fast drying, low viscosity solvent, water-based or UV curable inks fed from an anilox roller. Traditionally, patterns for flexographic printing plates (also known as flexo-masters) are created by bitmap patterns, where one pixel in bitmap image correlates to a dot of the flexographic printing plate. For instance. pixels arranged in a straight line in the bitmap image will turn into a continuous straight line on the flexographic printing plate. For flexographic printing (also known as flexo-printing), a flexible printing plate with a relief image is usually wrapped around a cylinder and its relief image is inked up and the ink is transferred to a suitable printable medium.

Flexographic printing plates typically have a rubbery or elastomeric nature whose precise properties may be adjusted for each particular printable medium. In general. the flexographic printing plate may be prepared by exposing a UV sensitive polymer layer through a photomask, or using other preparation techniques.

Application of flexographic printing as additive means has advantages. However, printing fine lines is difficult for many reasons. In some examples, the flexographic substrate may be too flexible, therefore, fine line patterns and small isolated dots are easily distorted making it difficult to maintain the quality of the fine printed lines and patterns.

In recent years, designs of electronic devices incorporating touch screen sensors have been using less area for electrical connection of the touch screen sensors to their controllers. This requires the use of thinner electrical bus lines with narrower spacing between each bus line. Printing these thin lines with narrow spaces can be difficult due to their susceptibility to damage in the flexographic printing plate and the potential for over-inking of the print features on the plate resulting in electrical short circuits.

Further, designs of electronic devices incorporating touch screen sensors have been using increasingly thinner materials, including thinner glass substrates, thinner touch sensor substrates, and thinner adhesive layers. Printing on thin substrates can be more challenging due to their tendency toward wrinkles and dimensional changes under tension.

U.S. Pat. No. 9,067,402 to Bielak describes the difficulty in printing small dots in a halftone application using flexography. Bielak solves this problem using additional UV exposure of scaffold dots to produce a raised floor around fine dots to provide sufficient mechanical support to prevent poor printing of the fine dots.

U.S. Patent Application Publication 2015/0122138 to Van Ostrand et al. describes several modes of failure to print fine lines. Van Ostrand et al. provides a change in the printed pattern at the junction of fine lines to protect the integrity of the lines and prevent unwanted printing at the junction locations.

U.S. Pat. No. 9,063,426 to Ramakrishnan et al. describe the use of support structures formed between the lines of a conductive mesh to prevent waves from being introduced into the printed lines.

Electrical devices of low visibility printed on a transparent substrate often include feature groups of parallel thin lines that carry charge or current cooperatively such that the lines are thin enough to be difficult to see, but the group of lines have enough charge carrying capability to provide the required electrical conductivity. A new failure mode has been observed in the printing of groups of parallel lines such that the outermost lines in either the in-track or cross-track direction (relative to the processing or web-transport direction) fail to print properly and show ragged or missing ink traces, thereby rendering the lines incapable of carrying current or charge and decrease the collective conductivity.

Another failure mode for printing fine lines results from the width of the features on a flexographic printing plate being of similar width as the cells of the anilox rollers used to provide uniform ink coverage to the flexographic printing plate. Due to the compressibility of the features on the flexographic printing plate, when outer features of a set of features are brought into contact with the anilox roller, under-inking can occur due to edge deformation, resulting in print defects that result in reduced or broken electrical connection.

There remains a need for a method to reliably fabricate an array of micro-wires by printing a set of fine lines using a flexographic printing system without breaks or other artifacts.

SUMMARY OF THE INVENTION

The present invention represents a method for forming a printed electrical device using a flexographic printing system, including:
providing a flexographic printing plate including a pattern of raised features for transferring ink from an anilox roller to a substrate, wherein the flexographic printing plate includes:
an active region wherein the pattern of raised features includes a plurality of traces that follow substantially parallel paths which print a corresponding pattern of active print features that are used to form active micro-traces that provide an electrical function in the printed electrical device, wherein adjacent traces in the plurality of traces are separated by a trace spacing; and
an inactive region adjacent to the active region wherein the pattern of raised features includes one or more protective features which print a corresponding pattern of protective print features that are used to form features that are electrically inactive in the printed electrical device, wherein the one or more protective features are separated from an outermost trace of the plurality of traces by a gap distance, the gap distance being between 60% and 250% of the trace spacing; and
using the flexographic printing plate in the flexographic printing system to transfer ink from the anilox roller to the substrate to provide a printed pattern corresponding to the pattern of raised features on the flexographic printing plate.

This invention has the advantage that the protective features enable the outermost conductive micro-wires formed by the outermost trace to have similar performance to the interior conductive micro-wires.

It has the additional advantage that the conductive micro-wires formed from the active print features will have more uniform electrical performance and characteristics.

BRIEF DESCRIPTION OF THE DRAWINGS

FIGS. 5A-5E illustrate an anilox roller pattern compared to typical wide and narrow features;

FIGS. 6A and 6B illustrate cross-sectional side profiles of relief-containing flexographic printing plates including a set of wide and narrow printing features, respectively;

FIG. 6C shows an enlarged view of the flexographic printing plate of FIG. 6B;

FIG. 7 is a high-level system diagram for an apparatus having a touch screen with a touch sensor that can be printed using embodiments of the invention;

FIGS. 13A-13H illustrate patterns of features including sets of parallel traces and protective features in accordance with exemplary embodiments of the present invention.

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

The present description will be directed in particular to elements forming part of, or cooperating more directly with, an apparatus in accordance with the present invention. It is to be understood that elements not specifically shown, labeled, or described can take various forms well known to those skilled in the art. It is to be understood that elements and components can be referred to in singular or plural form, as appropriate, without limiting the scope of the invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The example embodiments of the present invention are illustrated schematically and not to scale for the sake of clarity. One of ordinary skill in the art will be able to readily determine the specific size and interconnections of the elements of the example embodiments of the present invention.

References to upstream and downstream herein refer to direction of flow. Web media moves along a media path in a web advance direction from upstream to downstream. Similarly, fluids flow through a fluid line in a direction from upstream to downstream. In some instances a fluid can flow in an opposite direction from the web advance direction. For clarification herein, upstream and downstream are meant to refer to the web motion unless otherwise noted.

Figure 1:
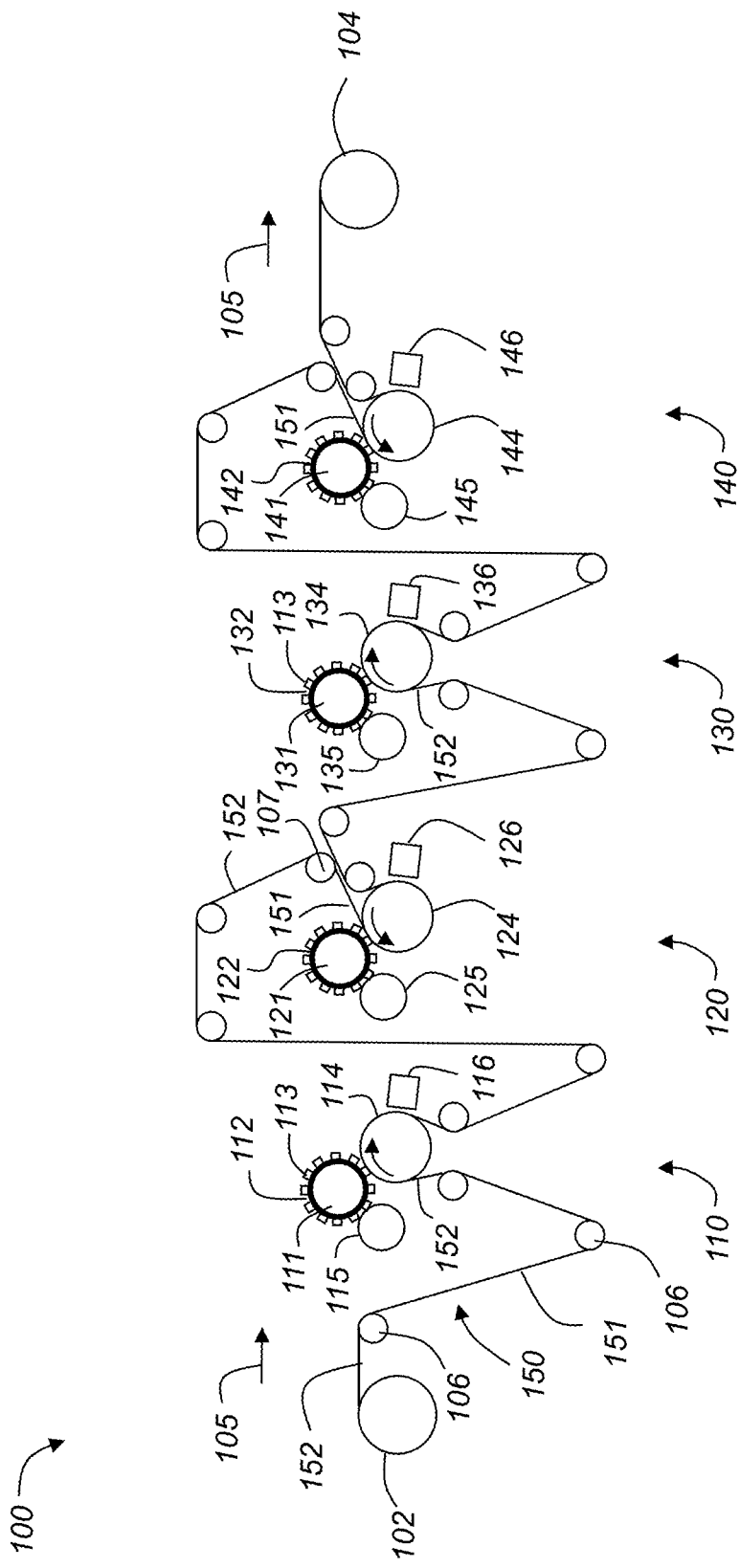
FIG. 1 is a schematic side view of a flexographic printing system for roll-to-roll printing on both sides of a substrate.

FIG. 1 is a schematic side view of a flexographic printing system 100 that can be used in some embodiments of the invention for roll-to-roll printing of a catalytic ink or a conductive ink on both sides of a substrate 150 for subsequent electroless plating. Substrate 150 is fed as a web from supply roll 102 to take-up roll 104 through flexographic printing system 100. Substrate 150 has a first side 151 and a second side 152.

The flexographic printing system 100 includes two print modules 120 and 140 that are configured to print on the first side 151 of substrate 150, as well as two print modules 110 and 130 that are configured to print on the second side 152 of substrate 150. The web of substrate 150 travels overall in process direction 105 (left to right in the example of FIG. 1). However, various rollers 106 and 107 are used to locally change the direction of the web of substrate as needed for adjusting web tension, providing a buffer, and reversing the substrate 150 for printing on an opposite side. In particular, note that in print module 120 roller 107 serves to reverse the local direction of the web of substrate 150 so that it is moving substantially in a right-to-left direction.

Each of the print modules 110, 120, 130, 140 includes some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing plate 112, 122, 132, 142. Impression cylinders 124 and 144 of print modules 120 and 140 (for printing on first side 151 of substrate 150) rotate counter-clockwise in the view shown in FIG. 1, while impression cylinders 114 and 134 of print modules 110 and 130 (for printing on second side 152 of substrate 150) rotate clockwise in this view.

Each print module 110, 120, 130, 140 also includes a respective anilox roller 115, 125, 135, 145 for providing ink to the corresponding flexographic printing plate 112, 122, 132, 142. As is well known in the printing industry, an anilox roller is a hard cylinder, usually constructed of a steel or aluminum core, having an outer surface containing millions of very fine dimples, known as cells. Ink is provided to the anilox roller by a tray or chambered reservoir (not shown). In some embodiments, some or all of the print modules 110, 120, 130, 140 also include respective UV curing stations 116, 126, 136, 146 for curing the printed ink on substrate 150.

Figure 2:
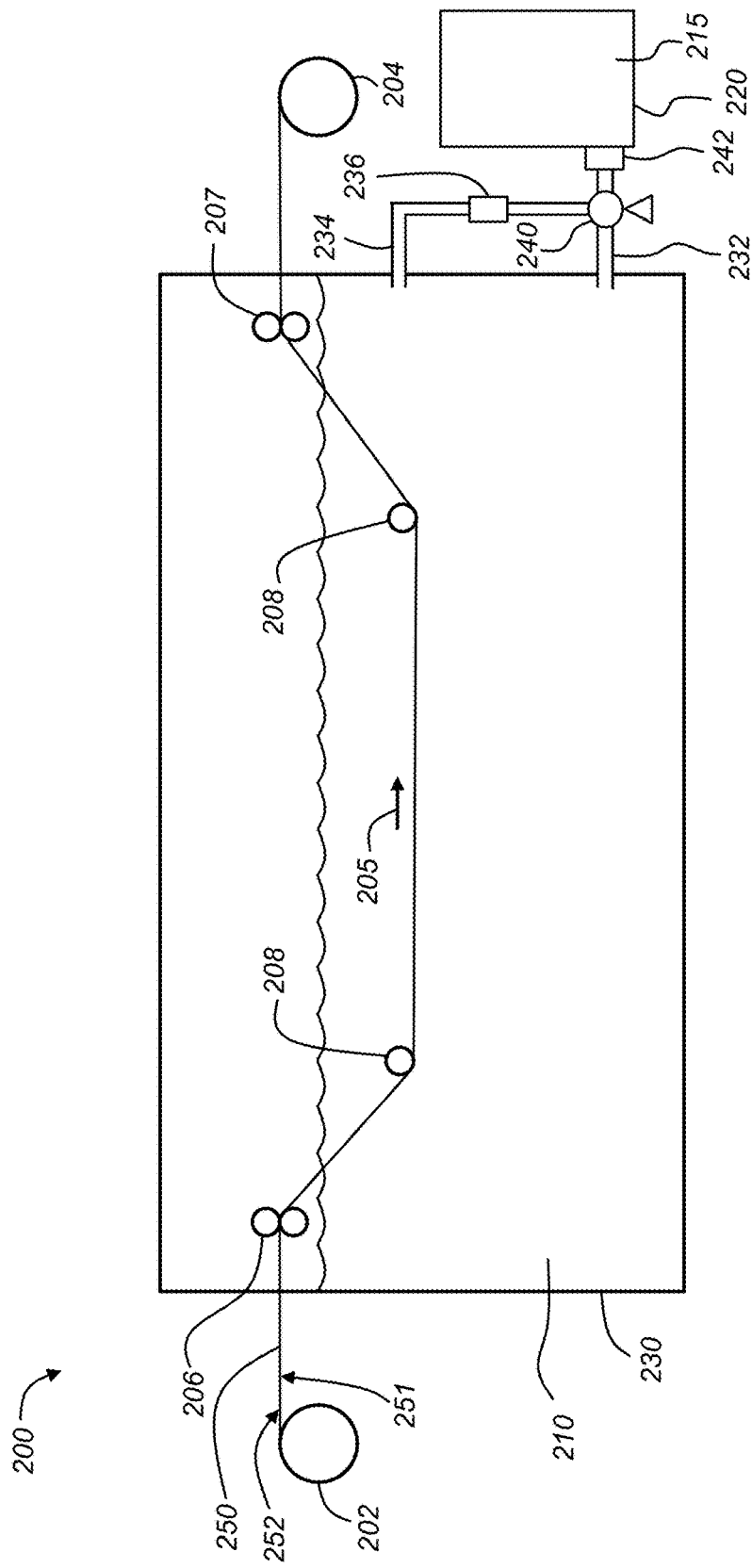
FIG. 2 is a schematic side view of a roll-to-roll electroless plating system.

FIG. 2 is a schematic side view of a roll-to-roll electroless plating system 200 disclosed in commonly-assigned, co-pending U.S. Patent Application Publication 2016/0168713 to Reuter et al., which is incorporated herein by reference. The electroless plating system 200 includes a tank 230 of plating solution 210. Web of media 250 is fed by a web advance system along a web-transport path in an in-track direction 205 from a supply roll 202 to a take-up roll 204. The web of media 250 is a substrate upon which electroless plating is to be performed. Drive roller 206 is positioned upstream of the plating solution 210 and drive roller 207 is positioned downstream of the plating solution 210. Drive rollers 206 and 207 advance the web of media 250 from the supply roll 202 through the tank of plating solution 210 to the take-up roll 204. Web-guiding rollers 208 are at least partially submerged in the plating solution 210 in the tank 230 and guide the web of media 250 along the web-transport path in the in-track direction 205.

As the web of media 250 is advanced through the plating solution 210 in the tank 230, a metallic plating substance such as copper, silver, gold, nickel or palladium is electrolessly plated from the plating solution 210 onto predetermined locations on one or both of a first surface 251 and a second surface 252 of the web of media 250. As a result, the concentration of the metal or other components in the plating solution 210 in the tank 230 decreases and the plating solution 210 needs to be refreshed. To refresh the plating solution 210, it is recirculated by pump 240, and replenished plating solution 215 from a reservoir 220 is added under the control of controller 242, which can include a valve (not shown). In the example shown in FIG. 2, plating solution 210 is moved from tank 230 to pump 240 through a drain pipe 232 and is returned from pump 240 to tank 230 through a return pipe 234. In order to remove particulates from plating solution 210, a filter 236 can be included, typically downstream of the pump 240.

Figure 3:
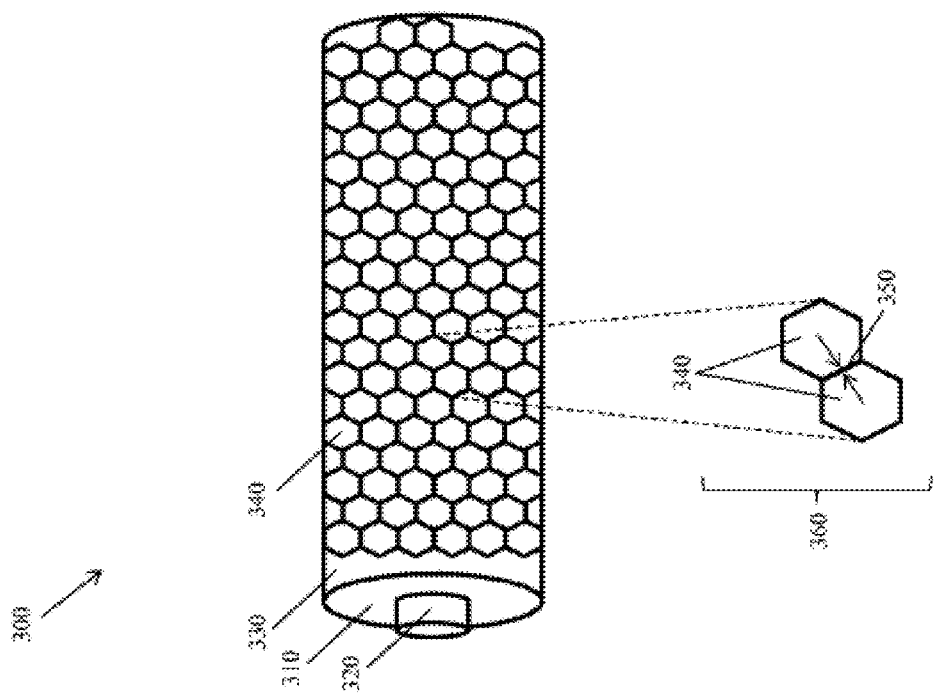
FIG. 3 shows an anilox roller used in a flexographic printing process.

FIG. 3, taken from U.S. Patent Application Publication 2014/0349013 to Ramakrishnan et al., which is incorporated herein by reference, shows a conventional anilox roller 300 used in a flexographic printing process. The anilox roller 300 controls, in part, the volume of ink or other material transferred to a flexographic printing plate (not shown) during the flexographic printing process. The anilox roller 300 includes a rigid cylinder 310 typically constructed of steel, a carbon fiber composite, a carbon fiber composite covered with metal, chrome, or an aluminum core with steel. One or more roller mounts 320 are disposed on the distal ends of cylinder 310 to secure and rotate the cylinder 310 during the flexographic printing process. Prior to depositing a hard ceramic coating 330, the cylinder 310 is typically polished so that a longitudinal contact surface around cylinder 310 is smooth. After deposition, the ceramic coating 330 is preferably polished so that a longitudinal contact surface of ceramic coating 330 around cylinder 310 is smooth. The ceramic coating 330 is polished smooth because it is the contact surface of the cylinder.

A plurality of cells 340 are patterned into the ceramic coating 330, but do not extend into the cylinder 310. Each cell 340 is a small indentation of a predetermined geometry in the ceramic coating 330 that holds and meters the amount of ink or other material (not shown) to be transferred to the flexographic printing plate during the flexographic printing process. A close-up view 360 shows a common wall 350 formed by adjacent cells 340. For the cell geometry depicted in the figure, a given cell 340 shares common walls 350 with six neighboring cells 340. However, the number of common walls 350 shared by a given cell 340 may vary depending on the geometry of the cell 340 used in an application.

Figure 4:
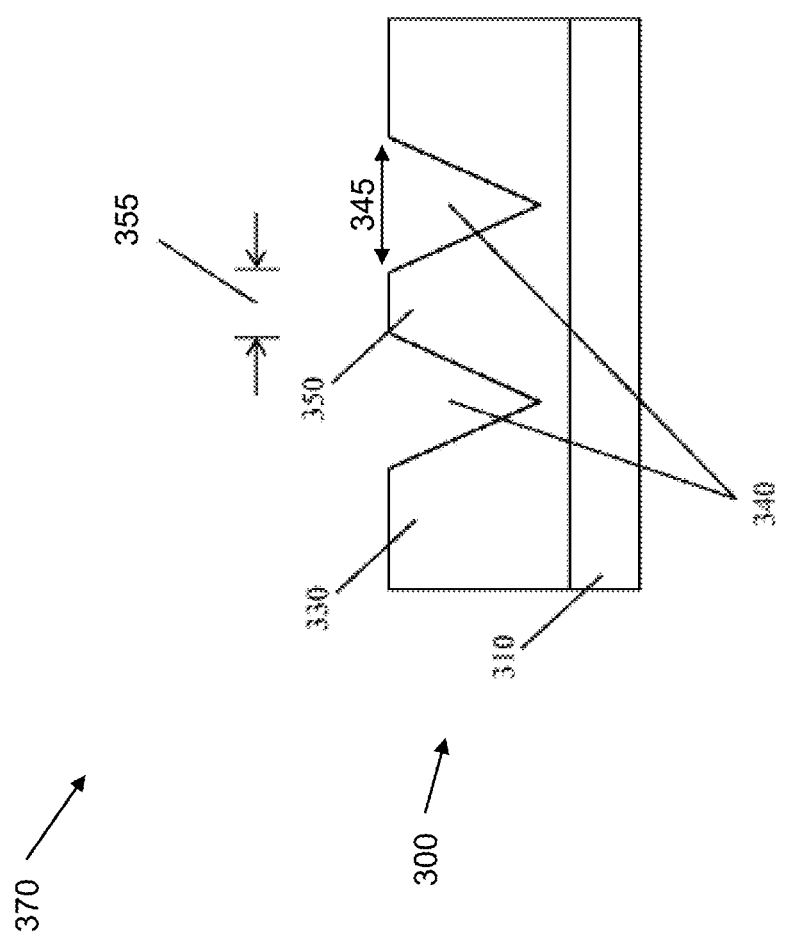
FIG. 4 shows a cross-sectional view of the anilox roller of FIG. 3.

FIG. 4, adapted from aforementioned U.S. Patent Application Publication 2014/0349013, shows a cross-sectional view 370 through a surface of the anilox roller 300 of FIG. 3. The ceramic coating 330 covers the longitudinal contact surface of cylinder 310, and generally has a thickness of at least 10 microns. A plurality of cells 340 are patterned into the ceramic coating 330, but do not extend into cylinder 310. The volume of ink or other material (not shown) held by a given cell 340 is typically measured in units of Billion Cubic Microns ("BCMs"). A given cell 340 generally holds a volume of at least 0.5 BCM or more of ink or other material suitable for printing standard geometry lines and features. Each cell 340 typically has a cell size 345 of 10 microns or more.

In the depicted cross-section, a common wall 350 is formed between adjacent cells 340 patterned into ceramic coating 330. The wall 350 is composed entirely of ceramic coating 330 and has a wall thickness 355, which is typically related to the cell density. As the cell density increases, the thickness 355 of the wall 350 generally decreases. If the thickness 355 of wall 350 becomes too thin, it may break from contact with the doctor blade or the flexographic printing plate during the flexographic printing process or wear out over time from repeated use. If the wall 350 between adjacent cells 340 breaks, a substantially larger cell will be formed, resulting in inconsistent ink transfer volumes. Inconsistent ink transfer volumes can result in print quality issues due to excess inking. Consequently, the cell density may be limited by a minimally sufficient wall thickness 355 that is necessary for reliable use. Typically, the wall 350 has a thickness 355 of 1 microns or more for printing standard geometry lines and features. For example, in one example, the sum of the wall thickness 355 and the cell size 345 of an anilox roller 300 configured to deliver 0.5 BCM with 2000 lpi (lines per inch) is 12.7 microns, with the wall thickness 355 at approximately 1 to 2 microns and the cell size 345 at approximately 10.7 to 11.7 microns. For anilox rollers with lower cell density (or lpi), the cell size 345 will increase accordingly.

FIGS. 5A and 5B show enlarged views of an anilox roller pattern 380 consisting of a close packed hexagonal array of cells 340 compared to typical flexographic printing plate features 410 and 415. Feature 410 represents a raised surface of a flexographic printing plate in the shape of a wide line. Features 415 represent narrow raised surfaces of a flexographic printing plate used for printing fine lines, such as those required for printing electrical devices with micro-wires fine enough to be difficult to see. The relationship of the dimensions of the cell 240 and the feature widths are approximately to scale. For example, a typical cell width is 10 microns or more, and a fine line width requirement for an invisible touch screen is typically about 3-6 microns. Electrical bus lines typically have widths of 1-30 microns, and more preferably 4-20 microns. Wide features, such as feature 410, would have line widths greater than 30 microns. The process direction 105 (i.e., the in-track direction) is indicated by an arrow indicating that the features 410, 415 in these examples are aligned with the process direction 105.

Figure 5D:
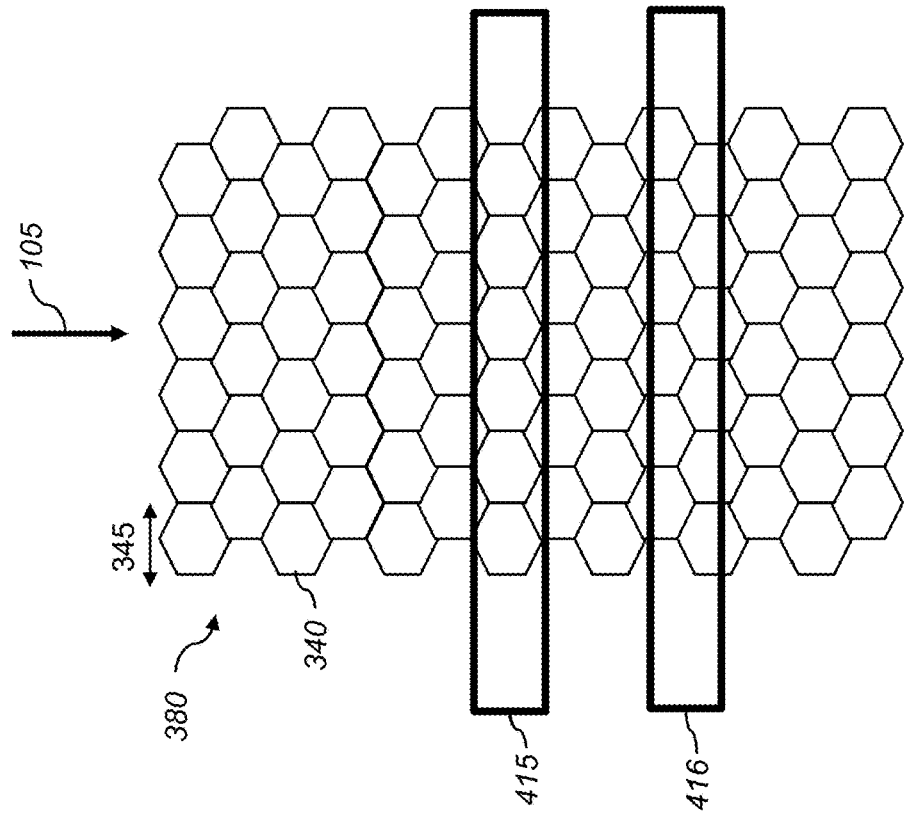
Figure 5C:
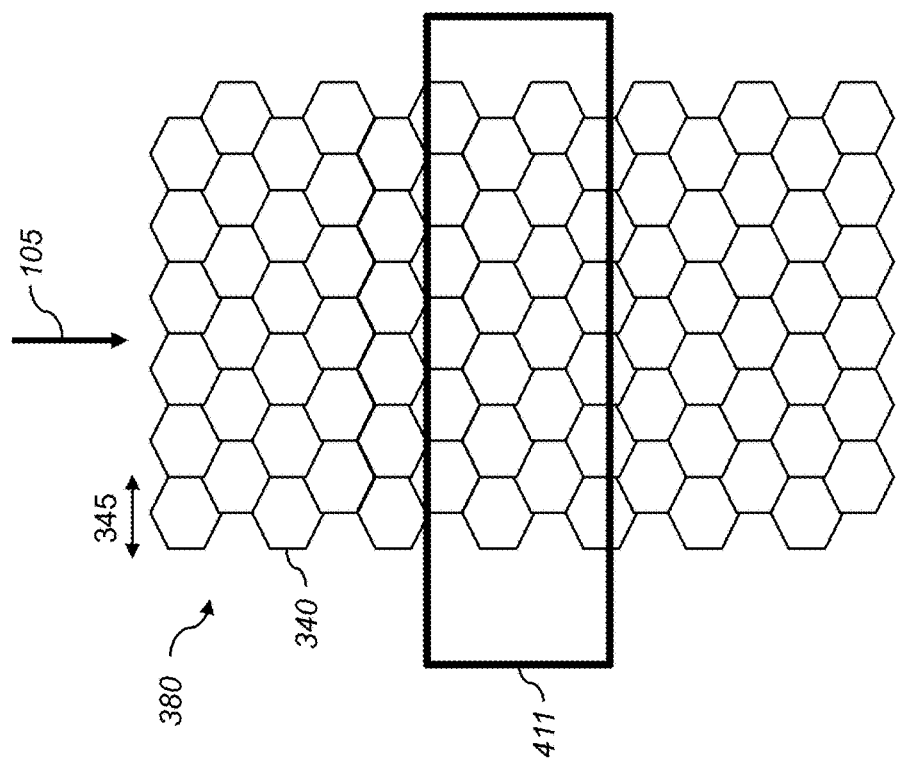

FIGS. 5C and 5D show enlarged views of an anilox roller pattern 380 consisting of a close packed hexagonal array of cells 340 compared to typical flexographic printing plate features 411, 415, 416. In these examples, the features 411, 415, 416 are perpendicular to the process direction 105 such that they are aligned to the cross-track direction. Feature 411 represents a raised surface of flexographic printing plate in the shape of a wide line. Features 415, 416 represent narrow raised surfaces of flexographic printing plate used for printing fine lines, such as those required for printing electrical devices with micro-wires fine enough to be difficult to see. The relationship of the cell 340 dimensions and the feature widths are approximately to scale. For example, a typical cell width is 10 microns or more and a fine line requirement for an invisible touch screen is approximately 10 microns. Wide features, such as 411, would have line widths greater than 30 microns.

Figure 5E:
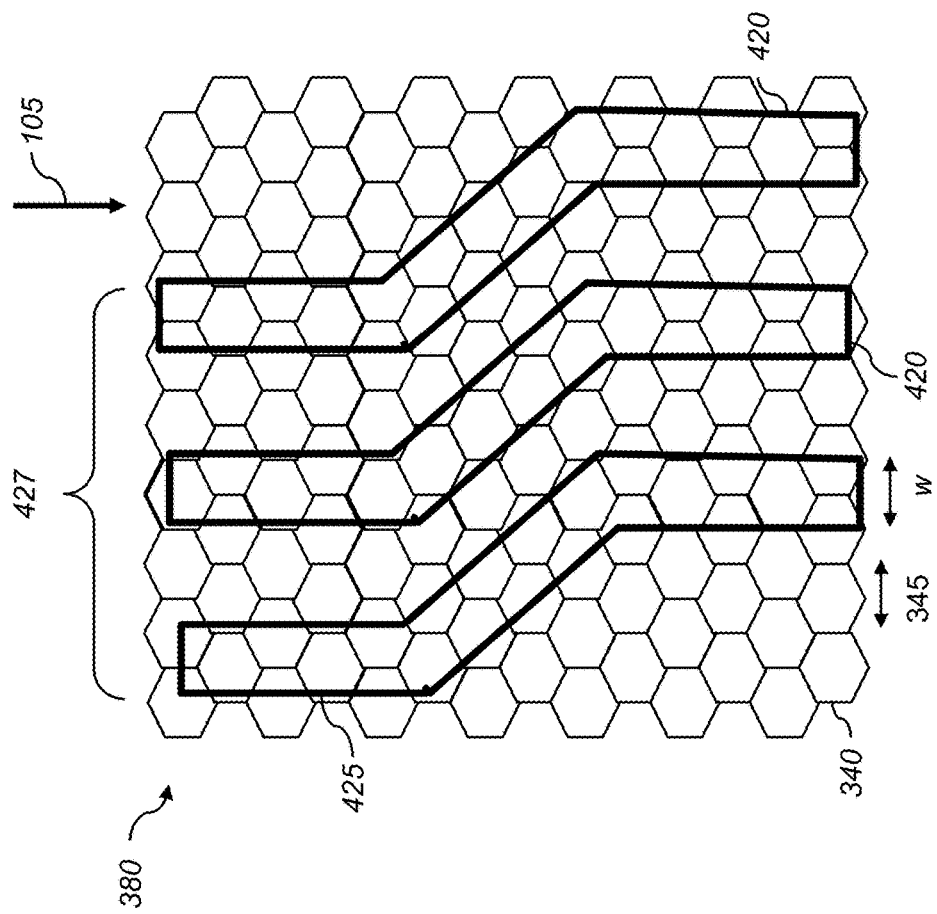

FIG. 5E show an enlarged view of an anilox roller pattern 380 consisting of a close packed hexagonal array of cells 340 compared to typical flexographic printing plate features 420, 425, which are part of a set of features 427. Features 420, 425 represent raised features on the surface of the flexographic printing plate in the shape of bent lines (i.e., traces) with a fine line width. Feature 425 is located at the outermost position of the set of features 427. The present invention is particularly well-suited for cases where the trace width W of the features 420, 425 is on the order of the cell size 345, such as where the trace width W is less than 200% of the cell size 345.

FIGS. 6A and 6B show cross-sectional side profiles of relief-containing flexographic printing plates 450, 451, respectively, provided with raised relief images onto which ink is applied for application to a printable material. FIG. 6A shows a flexographic printing plate 450 with a set of wide printing features 460, 461, representing cross-sections through a set of wide parallel traces, where the last feature 461 corresponds to the outermost line in the set of parallel lines. FIG. 6B shows a flexographic printing plate 451 with a set of wide printing features 465, 466, representing cross-sections through a set of narrow parallel traces, where the last feature 466 corresponds to the outermost line in the set of parallel lines. The raised printing features 460, 461, 465, 466 include printing surfaces 470.

FIG. 6C shows an enlarged view of the raised printing features 465 of FIG. 6B that is useful for defining relevant terminology. The printing features 465 in this case are a set of narrow parallel traces. The printing surfaces 470 of the traces have a trace width W. In an exemplary configuration, the trace width W is between 1 micron and 30 microns, and is preferably between 1 micron and 20 microns. The distance between the traces can be referred to as the trace spacing S. In an exemplary configuration, the trace spacing is between 3 microns and 40 microns, and is preferably between 5 microns and 20 microns. Note that when the flexographic printing plate 451 is used to form a printed pattern, the printed features corresponding to the printing features 465 will generally have a different width (typically larger) than the trace width W, and therefore the spacing between the printed features will generally be different (typically smaller) that the trace spacing S.

When the flexographic printing plates 450, 451 are pressed against the anilox roller 300 (FIG. 3) in the flexographic printing process, the printing surfaces 470 of the last features 461, 466 have the weakest contact with the cells 340 of the anilox roller 300 because the of the long shoulders 471 and 476, respectively. In the case of the flexographic printing plate 450 with large feature 460, 461, this is not likely to be a problem, in part because of the extra width provides more mechanical stability but also because the wide inking surface of the raised features 460, 461 contact several anilox cells 340, giving ample latitude for transferring ink. In contrast, in the case of the flexographic printing plate 451 with the narrow feature 465, 466, it has been found that the outermost feature 461 is likely to print with significantly reduced quality. This is believed to be because the narrow features 465, 466 and the extended shoulder 476 are mechanically less stable, and also because the narrow features contact only one or two rows of anilox cells 340 (see FIGS. 5B and 5D). In this case, the quality of the printed image can depend significantly on the relative position of the features 465, 466 and the walls 350 between rows of anilox cells 340.

It should be noted that while it is theorized that the poor quality of the outermost narrow printed lines may be due to mechanical instability of the narrow features 465, 466 and the small size of the features 465, 466 relative to the anilox cells 340 lines, the present invention is not bound to the validity of this theory. The method of the present invention has been found to be effective to improve the quality of the narrow printed lines independent of the mechanism which may cause the lines to print poorly in the conventional arrangement.

Embodiments of the present invention can be used in the fabrication of various types of printed electrical devices including touch screen devices. FIG. 7 shows a high-level system diagram for an exemplary apparatus 500 (i.e., an electrical device) having a touch screen 510 including a display device 520 and a touch sensor 530 that overlays at least a portion of a viewable area of display device 520. Touch sensor 530 senses touch and conveys electrical signals (related to capacitance values for example) corresponding to the sensed touch to a controller 580. Touch sensor 530 is an example of an article that can be printed on one or both sides by the flexographic printing system 100 in accordance with the method of the present invention and plated using an embodiment of roll-to-roll liquid processing system 300.

Figure 8:
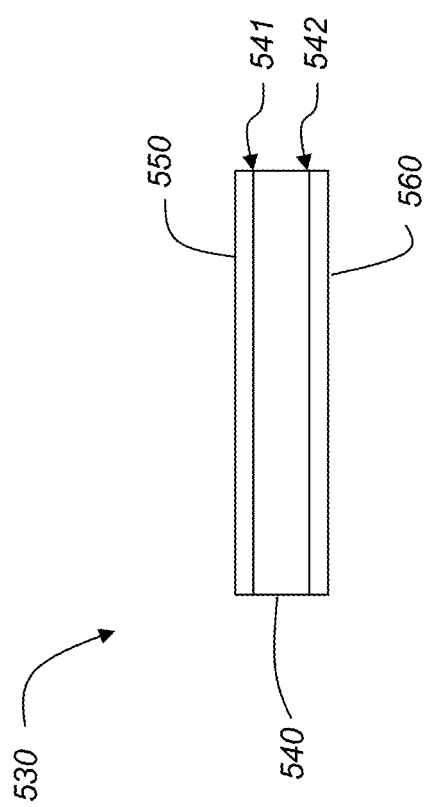
FIG. 8 is a side view of the touch sensor of FIG. 7.

FIG. 8 shows a schematic side view of a touch sensor 530. Transparent substrate 540, for example polyethylene terephthalate, has a first conductive pattern 550 printed and plated on a first side 541, and a second conductive pattern 560 printed and plated on a second side 542. The length and width of the transparent substrate 540, which is cut from the take-up roll 104 (FIG. 1), is not larger than the flexographic printing plates 112, 122, 132, 142 of flexographic printing system 100 (FIG. 1), but it could be smaller than the flexographic printing plates 112, 122, 132, 142.

Figure 9:
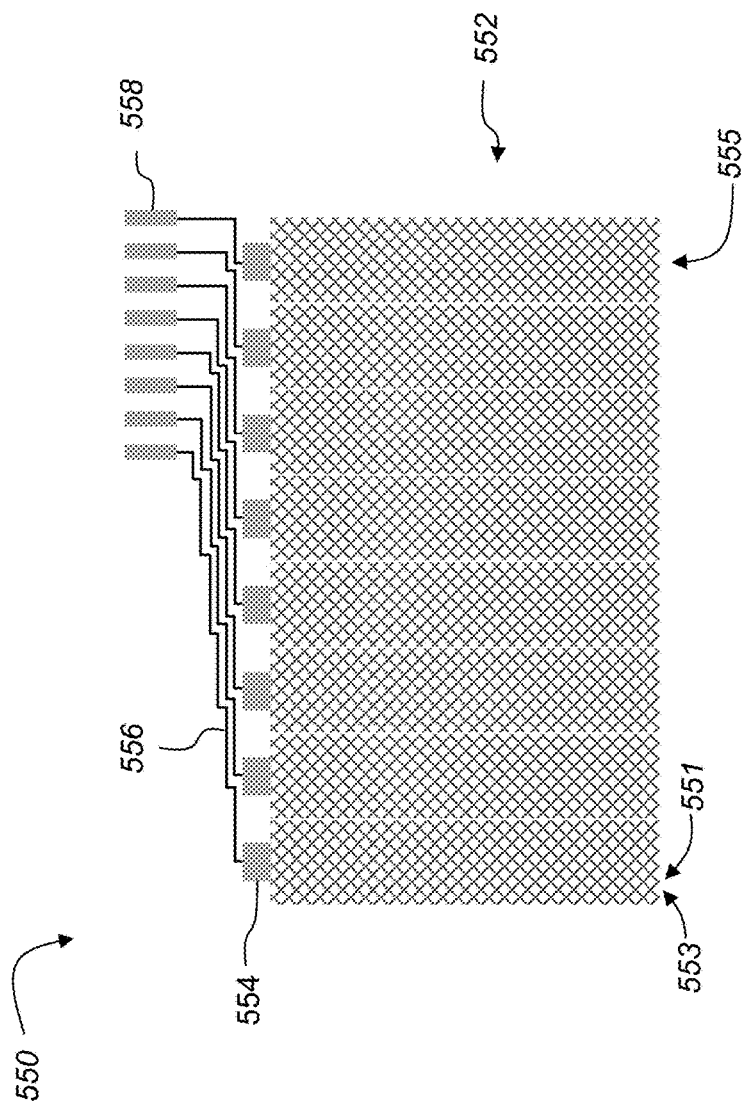
FIG. 9 is a top view of a conductive pattern printed on a first side of the touch sensor of FIG. 8.

FIG. 9 shows an example of a conductive pattern 550 that can be printed on first side 541 (FIG. 8) of transparent substrate 540 (FIG. 8) using one or more print modules such as print modules 120 and 140 of flexographic printing system (FIG. 1), followed by plating using a roll-to-roll electroless plating system 200 (FIG. 2). Conductive pattern 550 includes a grid 552 including grid columns 555 of intersecting fine lines 551 and 553 that are connected to an array of channel pads 554. Bus lines 556 connect the channel pads 554 to connector pads 558 that are connected to controller 580 (FIG. 7). Conductive pattern 550 can be printed by a single print module 120 in some embodiments. However, because the optimal print conditions for fine lines 551 and 553 (e.g., having line widths on the order of 4 to 8 microns) are typically different than for printing the wider channel pads 554, connector pads 558 and bus lines 556, it can be advantageous to use one print module 120 for printing the fine lines 551 and 553 and a second print module 140 for printing the wider features. Furthermore, for clean intersections of fine lines 551 and 553, it can be further advantageous to print and cure one set of fine lines 551 using one print module 120, and to print and cure the second set of fine lines 553 using a second print module 140, and to print the wider features using a third print module (not shown in FIG. 1) configured similarly to print modules 120 and 140.

Figure 10:
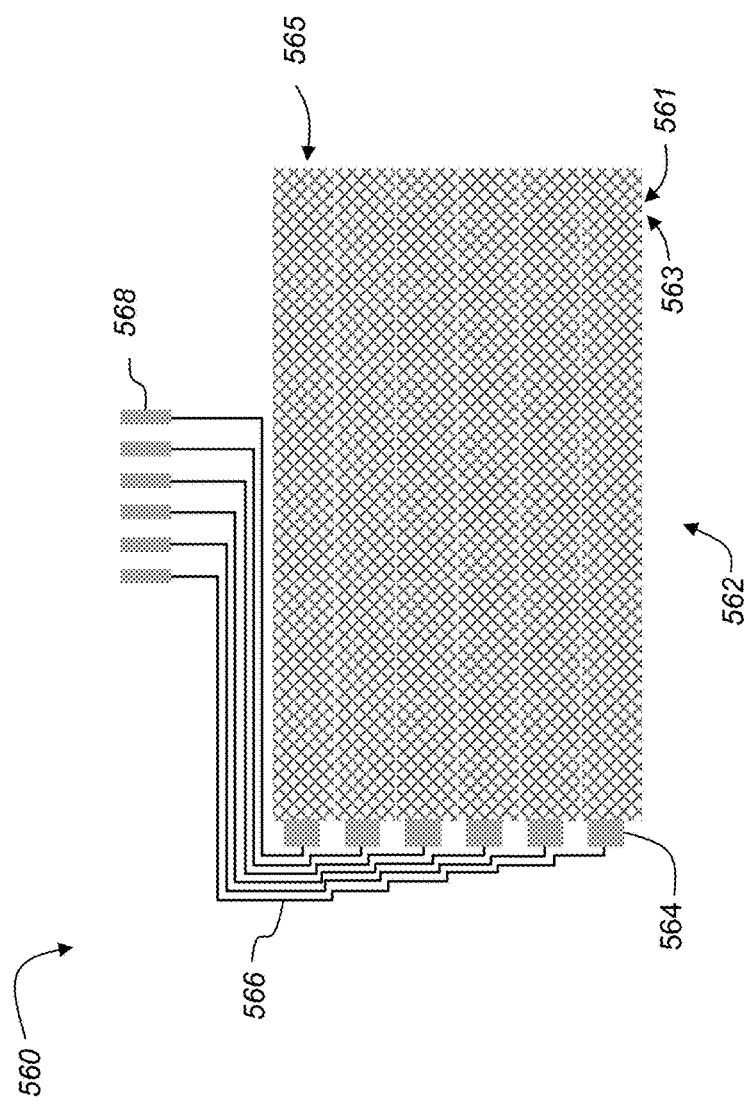
FIG. 10 is a top view of a conductive pattern printed on a second side of the touch sensor of FIG. 8.

FIG. 10 shows an example of a conductive pattern 560 that can be printed on second side 542 (FIG. B) of substrate 540 (FIG. 8) using one or more print modules such as print modules 110 and 130 of flexographic printing system (FIG. 1), followed by plating using a roll-to-roll electroless plating system 200 (FIG. 2). Conductive pattern 560 includes a grid 562 including grid rows 565 of intersecting fine lines 561 and 563 that are connected to an array of channel pads 564. Bus lines 566 connect the channel pads 564 to the connector pads 568 that are connected to controller 580 (FIG. A). In some embodiments, conductive pattern 560 can be printed by a single print module 110. However, because the optimal print conditions for fine lines 561 and 563 (e.g., having typical line widths on the order of 4 to 8 microns) are typically different than for the wider channel pads 564, connector pads 568 and bus lines 566, it can be advantageous to use one print module 110 for printing the fine lines 561 and 563 and a second print module 130 for printing the wider features. Furthermore, for clean intersections of fine lines 561 and 563, it can be further advantageous to print and cure one set of fine lines 561 using one print module 110, and to print and cure the second set of fine lines 563 using a second print module 130, and to print the wider features using a third print module (not shown in FIG. 1) configured similarly to print modules 110 and 130.

Alternatively, in some embodiments conductive pattern 550 can be printed using one or more print modules configured like print modules 110 and 130, and conductive pattern 560 can be printed using one or more print modules configured like print modules 120 and 140 of FIG. 1 followed by plating using a roll-to-roll electroless plating system 200 (FIG. 2) to simultaneously plate the patterns on both sides of the transparent substrate 540 (FIG. 8).

In the illustrated conductive patterns 550, 560 of FIGS. 9-10, the channel pads 554, 564 are shown to be along one edge of the respective grid columns 555 and grid rows 565. In other configurations, some of the channel pads 554 can be positioned along one end of the grid columns 555 and some of the channel pads 554 can be positioned along the opposite end of the grid columns 555. Likewise, some of the channel pads 564 can be positioned along one end of the grid rows 565 and some of the channel pads 564 can be positioned along the opposite end of the grid rows 565. In such cases, the bus lines 556, 566 can be routed around the perimeter of the conductive patterns 550, 560 to connect with the respective connecter pads 558, 568.

With reference to FIGS. 7-10, in operation of touch screen 510, controller 580 can sequentially electrically drive grid columns 555 via connector pads 558 and can sequentially sense electrical signals on grid rows 565 via connector pads 568. In other embodiments, the driving and sensing roles of the grid columns 555 and the grid rows 565 can be reversed.

Figure 11:
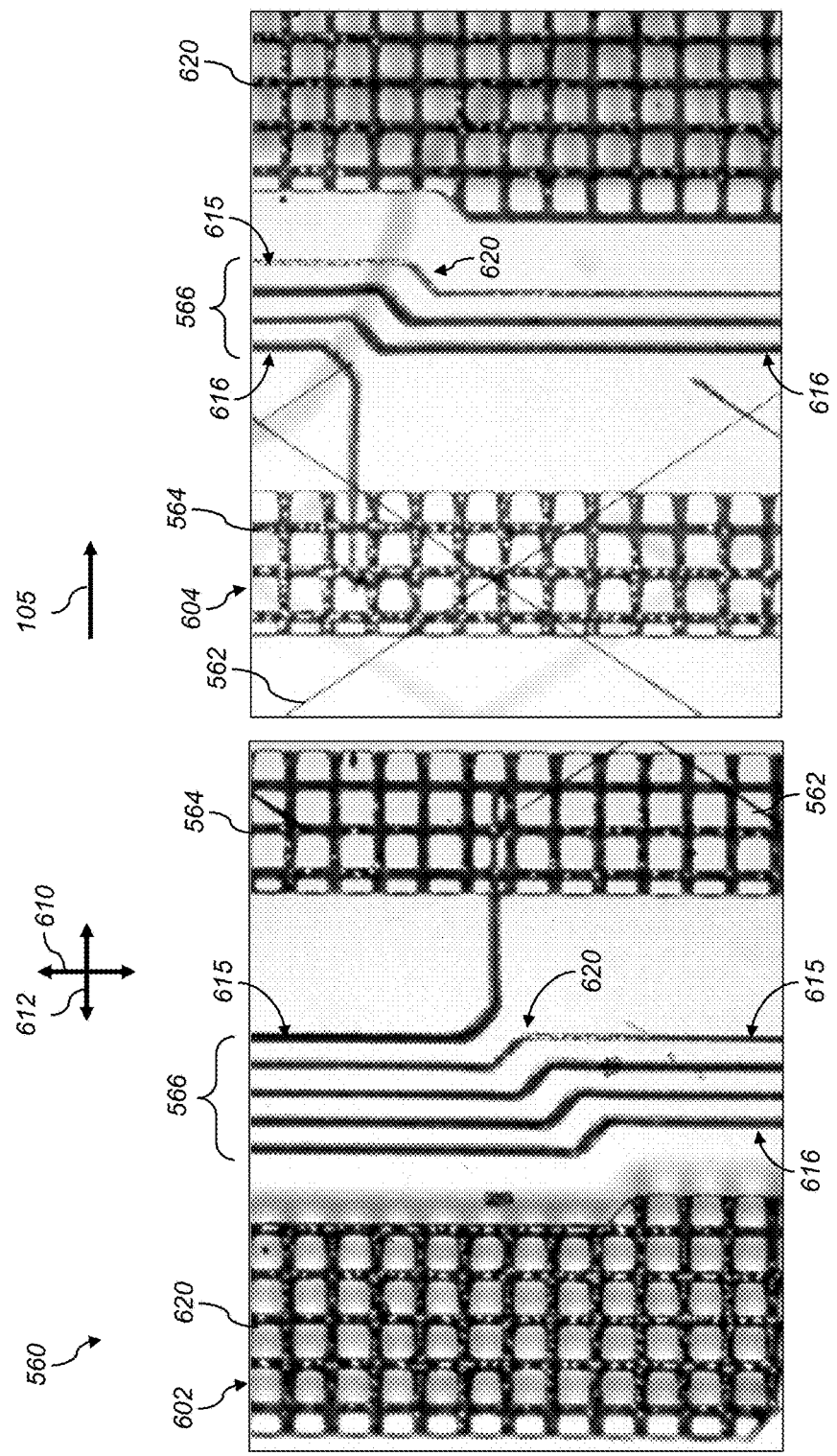
FIGS. 11-12 shows photographs of enlarged portions of exemplary conductive patterns for a touch sensor device.

FIG. 11 shows photographs of two enlarged portions 602, 604 of an exemplary conductive pattern 560 for a touch sensor device. The enlarged portion 602 is taken along the upstream edge (relative to the process direction 105) of the conductive pattern 560 and includes a set of substantially parallel traces corresponding to the bus lines 566 which connect the channel pads 564 to the connector pads 568 (FIG. 10). Each channel pad 564 is electrically connected to the corresponding grid row 565 (FIG. 10) of grid 562. A ground shield 620 is disposed around the perimeter of the conductive pattern 560 to electrically shield the touch sensor. In the illustrated configuration both the channel pad 564 and the ground shield are made using a mesh pattern. The enlarged portion 604 is taken along the downstream edge (relative to the process direction 105) of the conductive pattern 560 and includes similar features. This conductive pattern 560 was printed with an anilox roller configured to deliver 0.5 BCM with 2000 lpi (lines per inch). The raised features 465 (FIG. 6C) of the flexographic printing plate 451 (FIG. 6C) used to form the bus lines 566 had a width W of 14 microns and a spacing S of 24 microns.

In this exemplary configuration, the set of bus lines 566 are comprised of a set of traces that follow substantially parallel paths. Within the context of the present disclosure, the term "substantially parallel paths" does not imply that the paths are straight lines that are parallel according to a strict mathematical definition. Rather the traces can follow paths that include linear portions, as well as various bends 620 and curved segments. The paths are "substantially parallel" in the sense that adjacent traces follow along next to each other (along at least a portion of the path) and are separated by a substantially constant spacing, particularly along linear portions of the paths. Within the context of the present disclosure, the term "substantially constant spacing" means constant to within about 30%. Note that the spacing between the substantially parallel paths may exceed this limit in certain localized regions (e.g., near bends in the paths).

The bus lines 566 shown in FIG. 11 are substantially parallel to a cross-track direction 610 and perpendicular to an in-track direction 612. The in-track direction 612 corresponds to the process direction 105. The cross-track direction 610 is perpendicular to the process direction 105, and is parallel to a nip between the anilox roller 115 and the flexographic printing plate 112 (FIG. 1). Note that while the bus lines 566 extend in a direction which is roughly parallel to the cross-track direction 610, they include various bends 620 so that they are not strictly parallel along their entire length. Within the context of the present disclosure, a trace is said to be substantially parallel to a specified direction in a particular region if a best fit line through the trace in that region is parallel to the specified direction to within about ±10°.

The set of bus lines 566 include outermost traces 615, 616. In the illustrated example, the outermost traces 615 are on the downstream side of the set of bus lines 566 and the outermost traces 616 are on an upstream side of the set of bus lines 566. Note that as individual bus lines 566 connect to their corresponding channel pads 564 (or connector pads 568), the bus line 566 which corresponds to the outermost trace 615, 616 can change. For example, the bus line 566 corresponding to the outermost trace 615 at the top of the enlarged portion 602 is redirected to the right to connect to the channel pad 564. Below this point a different bus line 566 becomes the outermost trace 615.

As discussed earlier with respect to FIGS. 6A-6B, it has been observed that the outermost features in a set of features are more susceptible to artifacts where the features do not print clearly. This effect can clearly be seen in FIG. 11 where the outermost trace 615 in the set of bus lines 566 is poorly printed. In this example, it is the outermost traces 615 on the downstream side of the set of bus lines 566 that are most susceptible to printing artifacts. Portions of the outermost trace 615 in proximity to bends 620 have been found to be particularly susceptible to printing artifacts.

Figure 12:
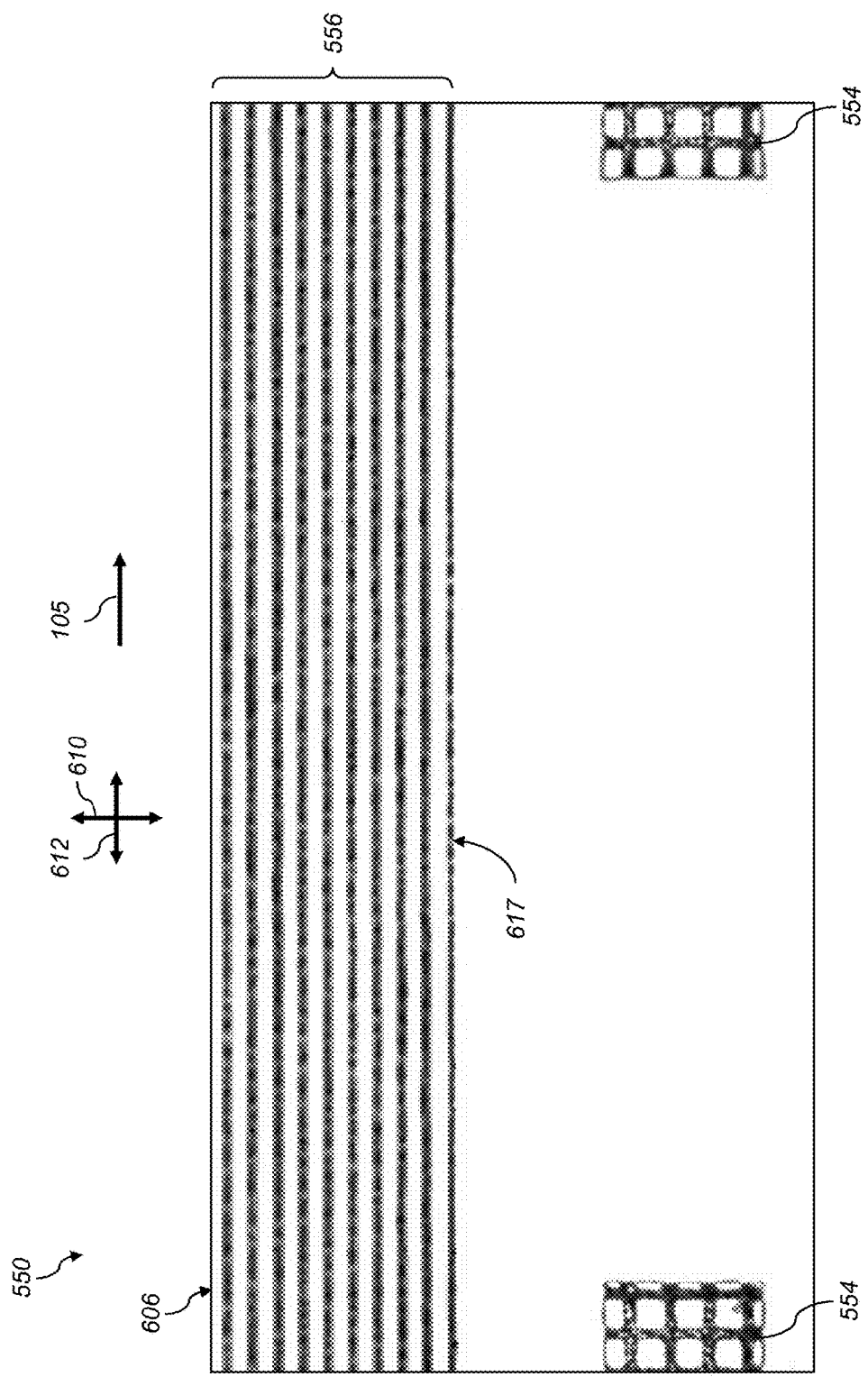

The defects in the outermost trace in a set of substantially parallel traces are not limited to cases where the traces are parallel to the cross-track direction 610. For example, FIG. 12 shows a photograph of an enlarged portion 606 of an exemplary conductive pattern 550 for a touch sensor device. The enlarged portion 606 is taken along a side edge of the conductive pattern 550 and includes a set of substantially parallel traces corresponding to the bus lines 556 which connect the channel pads 554 to the connector pads 558 (FIG. 10). Each channel pad 554 is electrically connected to the corresponding grid column 555 (FIG. 9) of grid 552 (FIG. 9). It can be seen that the outermost trace 617 of the set of bus lines 556 is poorly printed, exhibiting a significant loss of quality which will hamper product performance and quality. Portions of the outermost trace 617 that are between a pair of structures located adjacent to the set of substantially parallel traces (e.g., between adjacent channel pads 554) have been found to be particularly susceptible to printing artifacts.

Applicants have observed that while the outermost traces of a set of substantially parallel traces often suffers from a significant quality loss during the flexographic printing process, the interior traces are typically printed with a high quality level. Applicants have discovered that adding electrically inactive "protective features" in a region adjacent to the outermost trace can protect the outermost trace from exhibiting the associated image quality loss. Effectively, the protective features now become the "outermost trace" and the image quality degradations occur in the protective features rather than in the electrically active features. Since the protective features do not provide any electrical function, the image quality degradations will not impact the performance of the printed electrical device. The present invention is particularly useful for cases where raised features on a printing plate include a set of substantially parallel traces having printing surfaces 470 (FIG. 6B) with a narrow trace width typically between 1 micron and 30 microns. It is particularly well suited to micro-wires having trace widths of between 1 micron and 20 microns, and even more preferably between 2 microns and 15 microns.

It should be noted that while the present disclosure focuses on embodiments where the fine features are conductive micro-wires, one skilled in the art will recognize that the invention can be generalized to the formation of other types of active micro-traces that provide an electrical function (e.g., thin traces of other types of materials such as semiconductor materials or insulator materials).

Figure 13A:
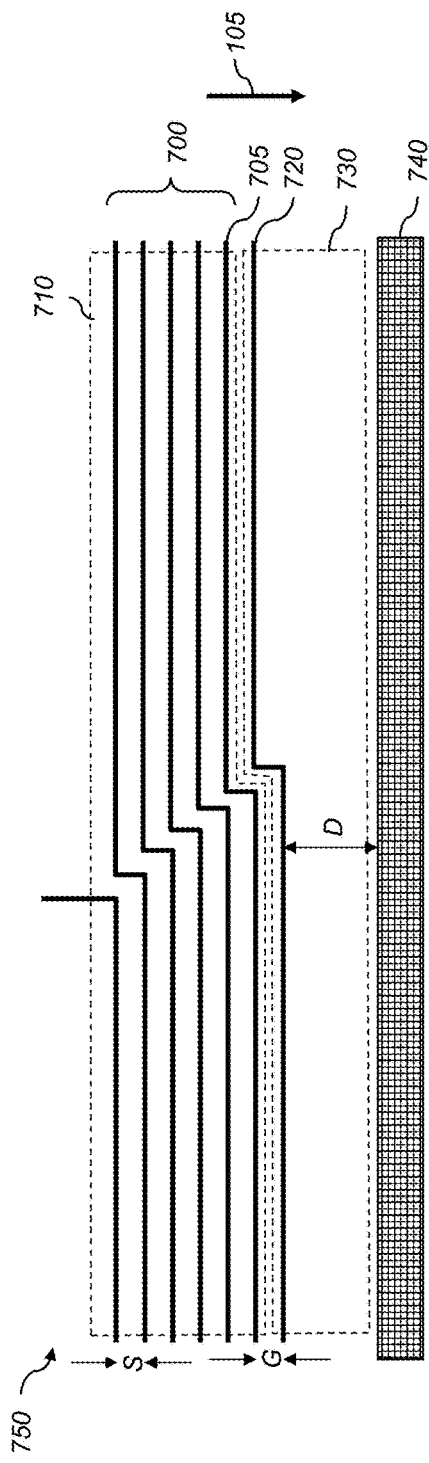

FIG. 13A illustrates a pattern of features 750 from a portion of a flexographic printing plate in accordance with an exemplary embodiment. The flexographic printing plate is used to form a printed electrical device such as a touch sensor or an RF antenna. As discussed earlier, in some embodiments the flexographic printing plate used in a flexographic printing system 100 (FIG. 1) to print a catalytic ink on a substrate 150, which is then processed using an electroless plating system 200 (FIG. 2) to provide the conductive features of the printed electrical device. In other embodiments, the flexographic printing plate used in a flexographic printing system 100 (FIG. 1) to print a conductive ink on a substrate 150, which provides the conductive features of the printed electrical device. In still other embodiments, the flexographic printing plate used in a flexographic printing system 100 (FIG. 1) to print an ink on a substrate 150, which provides the active features performing electrical functions of the printed electrical device. For example, the ink can be an insulator or can have semiconductor properties.

The catalytic ink includes a catalyst that can be converted the printed pattern to a conductive pattern by using an additional process such as electroless plating. Examples of catalytic inks appropriate for use in accordance with the present invention includes catalysts such as nano-particles of silver, gold, tin, platinum, cobalt or palladium. These catalysts are known to be effective for use with an electroless plating process such as that described relative to FIG. 2.

In other embodiments, the pattern of printed ink can be converted to a conductive pattern using other processes such as using the Photonic Curing treatment developed by NovaCentrix of Austin, Tex. which is described in U.S. Pat. No. 8,945,686.

The pattern of features 750 correspond to raised features on the flexographic printing plate, which will print a corresponding pattern of print features. The pattern of features 750 includes an active region 700 wherein the pattern of raised features includes a set of traces 700 that follow substantially parallel paths. The print features corresponding to the traces 700 are used to form conductive micro-wires (e.g., bus lines) that provide an electrical function in the printed electrical device. The electrical function will typically be to carry a current or a voltage to components of the printed electrical device. However, in other embodiments the electrical function can include any type of electrical function known in the art that can be provided by a conductive micro-wire in an electrical device. Adjacent traces in the set of traces 700 are separated by a trace spacing S, which will typically be between 3 microns and 40 microns, and more preferably between 5 microns and 20 microns. In an exemplary embodiment, the trace spacing S between each of the traces 700 is the same, however this is not required. Note that not all of the traces 700 in the active region are necessarily parallel to each other along their entire length. For example, in the pattern of features 750 of FIG. 13A, the uppermost trace 700 veers off in another direction toward the middle of the figure (e.g., to connect with a channel pad 564 (FIG. 11).

The pattern of features 750 also includes an inactive region 730 wherein the pattern of raised features includes one or more protective features 720. The protective features 720 print a corresponding pattern of protective print features. While the protective print features are generally used to form conductive features during the device fabrication process, those features are electrically inactive in the printed electrical device. The features are electrically inactive in the sense that they are not connected to any electrically active components and do not perform an electrical function. Note that while the electrically-inactive features do not perform an electrical function, their presence may have some impact of the electrical characteristics (e.g., the capacitance) of the electrically active features. However, any such effect will generally be quite small.

It has been found that, when they are arranged in appropriate geometries, the protective features 720 are effective to prevent artifacts from being introduced into the print features formed by the traces 700. In an exemplary embodiment, the protective features 720 are separated from the outermost trace 705 be a gap distance G which is on the same order as the trace spacing S. Typically, the gap distance is between 60% and 250% of the trace spacing S. Note that the term "outermost" is used here to refer to the outermost trace 705 in the set of traces 700 and does not relate to whether it is closer to the outside of the entire pattern of features 750. In various embodiments the outermost trace 705 can be on either of the set of traces 700. In this example, the outermost trace 705 is the most downstream trace 700 relative to the process direction 105 so that the protective features 720 are positioned downstream of the pattern of traces 700 (i.e., the protective features 720 print before the pattern of traces 700). However, in other embodiments the outermost trace can be the most upstream trace, or can be on either side of traces 700 aligned in the in-track direction.

In capacitive systems, the amount of conductive material that is located in proximity to the micro-wires can affect the performance of the micro-wires by creating additional capacitive storage which reduces the signal-to-noise of the device. The use of protective features 720 is particularly helpful when the traces 700 are separated from any other features 740 by a substantial since this corresponds to the configuration where artifacts are most likely to form. In an exemplary configuration, the protective features 720 are separated from the other features 740 by a distance D of at least 200% of the trace spacing S. In some embodiments the distance D is at least 40 microns.

The protective feature 720 shown in the exemplary configuration of FIG. 13A is a solid trace which runs along a path which is substantially parallel to the outermost trace 705. However, in other embodiments, the protective features 720 can be provided in a wide variety of patterns such as the examples illustrated in FIGS. 13B-13F.

Figure 13B:
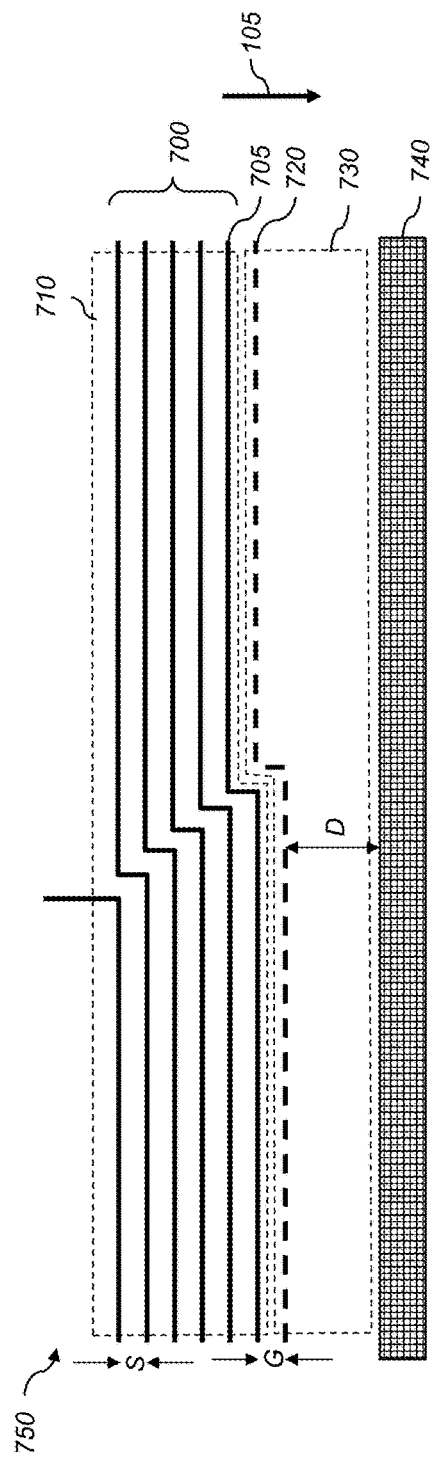

In the configuration of FIG. 13B, the protective features 720 are a dashed line made up of a set of line segments that follow along the same path as the protective feature 720 of FIG. 13A. Each of the line segments is substantially parallel to the outermost trace 705, and is separated by a consistent gap distance G. In other embodiments (not shown), the line segments can be oriented in a different direction such that they are perpendicular to or oblique to the outermost trace 750.

FIG. 13C illustrates a configuration similar to that of FIG. 13B except that the protective features 720 are arranged in a dotted line made up of a plurality of isolated dots.

As noted earlier, in some cases the poor printing artifacts are more likely to occur in proximity to bends 745 in the outermost trace 705 where it changes direction (e.g., from horizontal to vertical or diagonal). In this case, it may be necessary to only include protective features 720 in proximity to the bends as illustrated in FIG. 13D. Within the context of the present disclosure "in proximity to" should be taken to mean "within a predefined distance of". Preferably, the predefined distance is empirically determined based on the line portions where artifacts are observed. For example, protective features 720 can be used in a region that is within 200 microns of the bend 745. The arrangements of FIGS. 13B-13D have the advantage that any capacitive coupling between the protective features 720 and the pattern of traces 700 and other active features is reduced relative to the FIG. 13A configuration.

The configurations of FIGS. 13B-13D utilize protective features 720 that have a smaller total area relative to the configuration of FIG. 13A, and will therefore will produce smaller conductive features in the final printed electrical device. This has the advantage that any affect (e.g., a change in capacitance) that the electrically inactive features may have on the electrical function provided by the active components of the printed electrical device will be minimized. It will also reduce the amount of ink and plating chemistry that will be consumed during the fabrication process.

In the examples of FIGS. 13A-13D, all of the protective features 720 are arranged along a path which is substantially parallel to that of the outermost trace 705 so that they all have a similar gap distance G. In other embodiments, the protective features 720 can be arranged at different distances from the outermost trace 705. For example, FIG. 13E shows an exemplary configuration where the protective features 720 include a dashed line at a gap distance G as in FIG. 13C, as well as an additional set of protective features 720 at a larger distance from the outermost trace 705 (in this case about 2G) in proximity to the bend 745. This additional layer of protective features will further reduce the likelihood that artifacts are produced in the print features of the active region 710.

In the examples of FIGS. 13A-13E, all of the protective features 720 are disposed along one side (e.g., the downstream side) of the set of traces 700. In other embodiments, protective features can be positioned along both sides of the set of traces 700 as illustrated in FIG. 13F. In this example, a second inactive region 735 is positioned adjacent to a second outermost trace 707 of the active region 710 on an opposite side from the first inactive region 730. The second inactive region 735 includes one or more additional protective features 725 that print corresponding additional protective print features that will be electrically inactive in the printed electrical device.

Figure 13G:
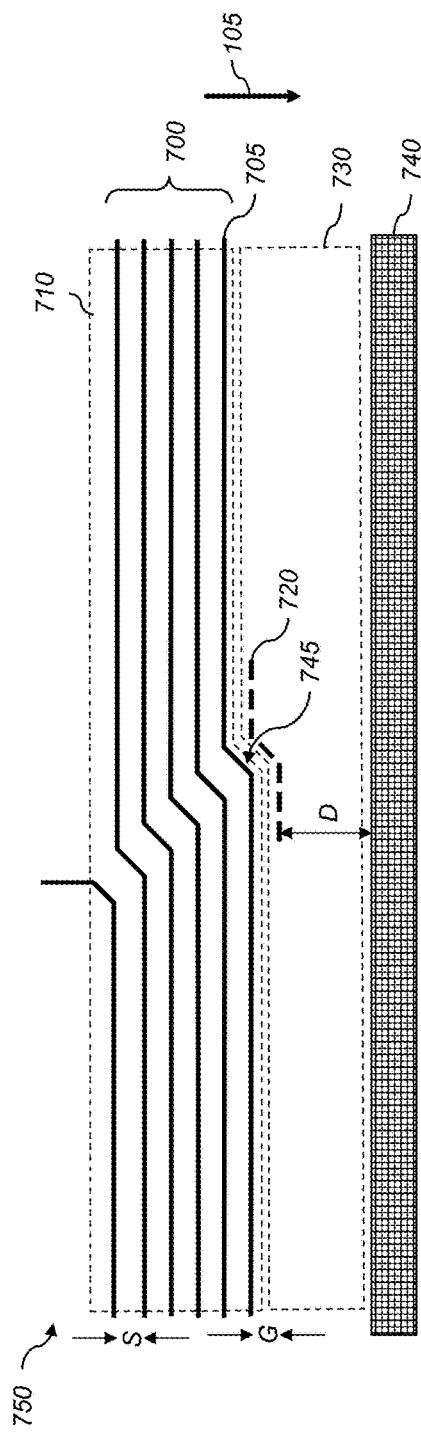
Figure 13H:
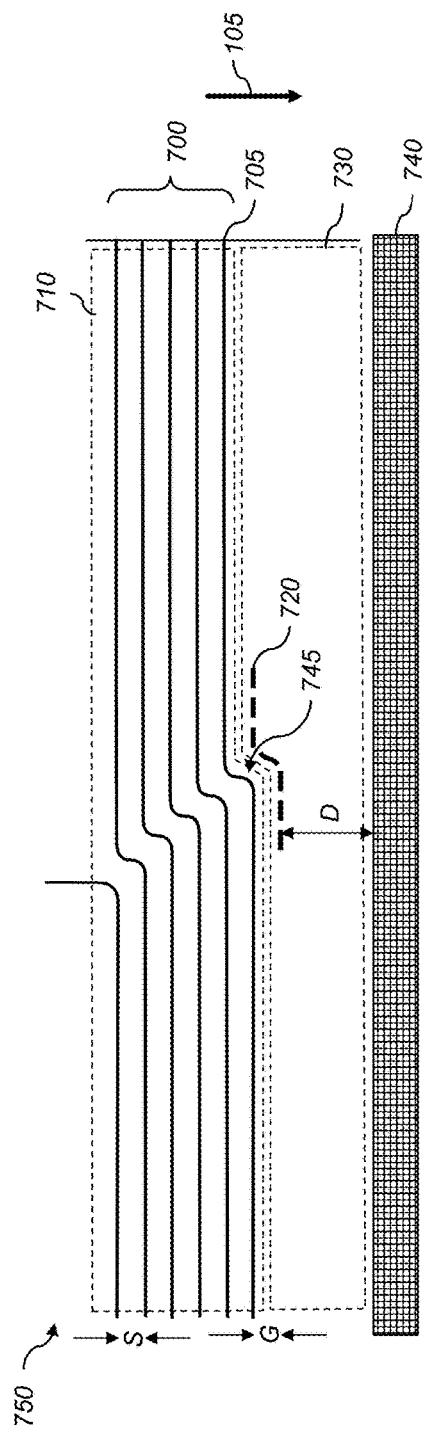

In the examples of FIGS. 13A-13F, the plurality of the traces 700 are comprised of a series of straight line segments which join at sharp right-angle bends. In other embodiments, the traces 700 can take other forms. For example, FIG. 13G illustrates an embodiment similar to that of FIG. 13D where the traces 700 have angled bends, and FIG. 13H illustrates an embodiment where the traces 700 have rounded bends.

Figure 14:
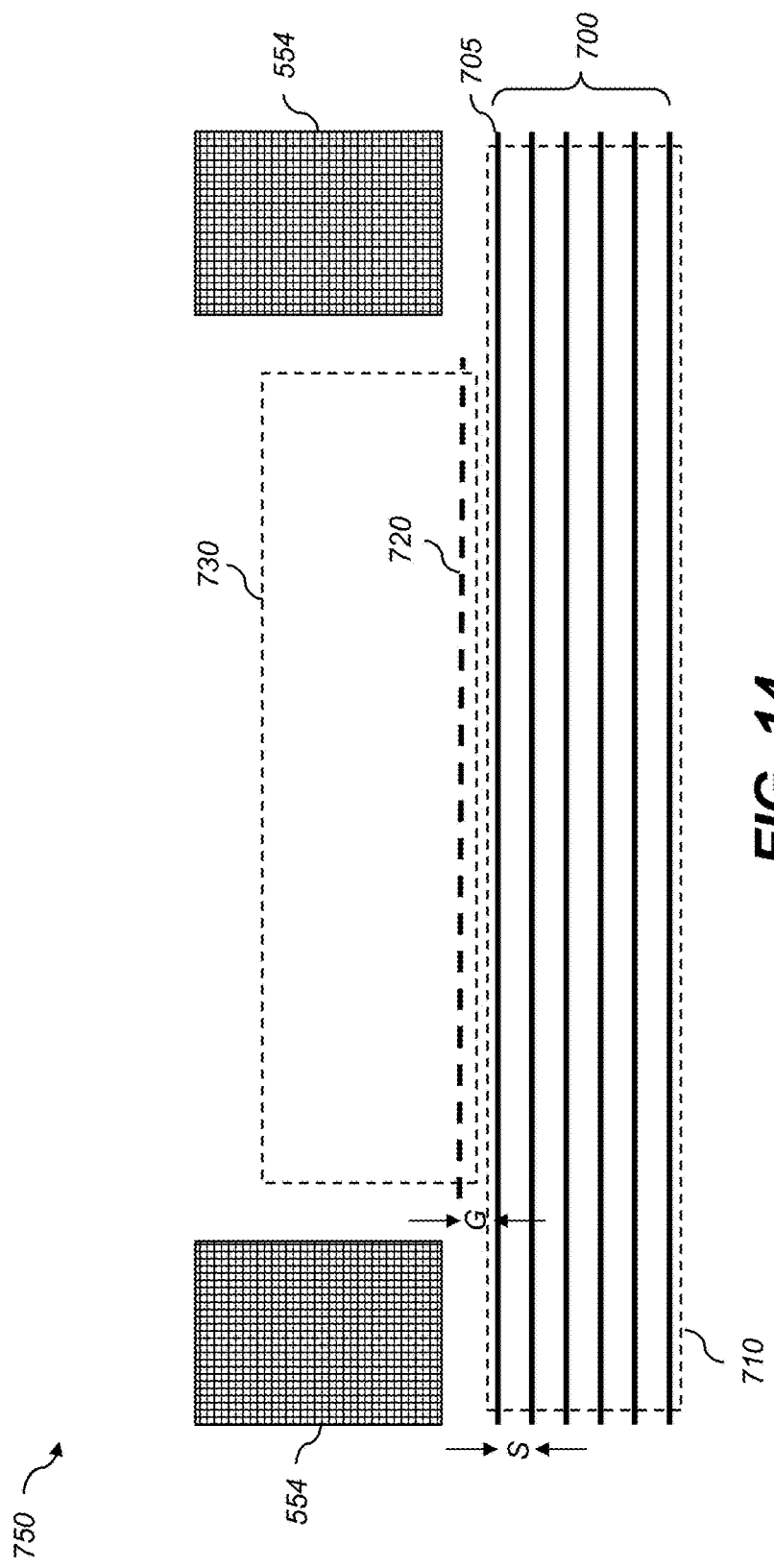
FIG. 14 illustrates a pattern of features including a set of parallel traces and protective features in accordance with an exemplary embodiments of the present invention.

FIG. 14 illustrates a pattern of features 750 from a portion of a flexographic printing plate in accordance with another exemplary configuration. In this case, the active region 710 includes a set of traces 700 in a region in proximity to two additional raised features (i.e., channel pads 554). As noted earlier, the outermost trace 705 is susceptible to more printing quality, particularly in the region between the channel pads 554. In this example, an inactive region 730 is defined adjacent to the outermost trace 705 of the active region 710 in the area laterally between the channel pads 554. One or more protective features 720 are then provided in the inactive region 730 spaced apart from the outermost trace 705 by a gap distance G and located laterally between the channel pads 554. This will protect the outermost trace 705 from image quality degradations.

The above described embodiments have involved printing a catalytic ink using a flexographic printing system 100 (FIG. 1) to provide printed features including a pattern of active print features that are used to form conductive micro-wires upon treating with an electroless plating system 200 (FIG. 2). In other embodiments, the flexographic printing system 100 (FIG. 1) can be used to print a conductive ink, thereby directly forming the conductive micro-wires without the need for a subsequent electroless plating process. In this case, the use of flexographic printing plates including protective features still provides the same advantage of protecting the electrical integrity of the outermost micro-wire. Examples of conductive inks that can be used in such embodiments would include inks containing high concentrations of silver nano-particles, typically greater than 50 weight percent in the dried state, more preferably greater than 60 weight percent in the dried state.

Exemplary inks that can be used in accordance with the present invention are described in U.S. Pat. No. 9,315,062, which is incorporated herein by reference. Appropriate Inks can include printable materials that are dissolved or suspended in suitable carrier solvents as described above and that are known in the art for this purpose. For example, a silver-containing electrically conductive printable material composition can include any useful amount of silver metal particles that are dispersed in aqueous or non-aqueous carrier solvents.

The method of the present invention can be used in many ways to form a printed pattern on a suitable substrate for use in devices and for components in a variety of applications including but not limited to, electronic, optical, sensory, and diagnostic devices. Such electronic and optical devices and components include but are not limited to, radio frequency tags (RFID), sensors, and memory and back panel displays. The method of this invention can be used to form patterns of electrically conductive materials, semi-conductive materials, dielectric materials, and colorants (dyes or pigments). The patterns can be designed to be temperature-sensitive or pressure-sensitive as well.

The present invention can also be used to form a pattern of a print material into transistor channels for top gate devices in which other materials, such as source materials and drain materials, are delivered to the channels. The method can form the print material into transistor channels on a semiconducting layer of the substrate for bottom gate devices in which source materials and drain materials are delivered to the channels. The other materials can be delivered into patterned cells on a receiver element by any means including ink jetting.

The present invention is useful for providing electrically conductive patterns that are designed for use as touch panel displays. Such electrically conductive patterns can be provided using print materials, such as electrically conductive metals and metallic salts that are electrically conductive, or can be processed or treated in some manner to become electrically conductive. Useful print materials of this type include but are not limited to, silver and silver salts such as silver halides, and silver behenate and other organic silver salts. Such electrically conductive metal patterns can be further processed for example using electroless metal plating.

Some particularly useful print materials include but are not limited to, electrically conductive inks containing electrically conductive particles such as metal flakes or particle or nano-wires. Electrically conductive inks include electrically conductive silver-containing inks, gold-containing inks, copper-containing inks, carbon-containing inks, palladium-containing inks, and inks containing catalytic "seed" materials for electroplating or electroless plating. Some of such inks can be obtained commercially from sources such as InkTec (California), Flint Ink Corporation (Michigan), and Method Development Company (Chicago). Some of these "inks" can be used as a carrier liquid while other inks comprise both a carrier liquid and a print material. It is also possible to use print materials that contain UV-curable components.

Print materials include for example, electrically conductive materials, semi-conductive materials, and dielectric materials. Examples of electrically conductive materials include but are not limited to, conductive polymers, nanoparticles of indium-tin oxide, metals such as gold, silver and silver precursors, copper, and palladium, metal complexes, metal alloys, and combinations thereof. A print material can alternatively be a conductive material precursor such as a metal salt (for example a silver salt like a silver halide or an organic silver salt), or an electroless metallization catalyst such as palladium particles. Examples of useful electrically semi-conductive inorganic materials include but are not limited to silicon, germanium, gallium arsenide, zinc oxide, and zinc selenide, and combinations thereof.

Print materials can be of any form including particulate, polymeric materials, small molecule materials, and other forms that would be apparent to a skilled worker. For example, useful electrically semi-conductive materials and dielectric materials can be used as particulate print materials. Useful particulate or film-forming polymeric print materials include electrically conductive polymers including but not limited to, homopolymers and copolymers comprising polythiophenes, polyanilines, polypyrroles, polycarbazoles, polyindoles, polyazepines, polyethylenedioxythiophenes, poly(3-alkylthiophenes), poly(p-phenylene vinylene)'s, polyp-phenylene)'s, poly(styrene sulfonic acid) (PSS), poly (p-phenylene sulfide), polyacetylene, poly(3,4-ethylene dioxythiophene) (PEDOT), and a mixture of poly(styrene sulfonic acid) and poly(3,4-ethylene dioxythiophene) (PSS: PEDOT).

It is also possible that the print materials are nanoparticles of electrically conductive, electrically semi-conductive, and dielectric materials. Nanoparticles are microscopic particles whose size is measured in nanometers (nm). Nanoparticles include particles having at least one dimension less than 200 nm and in some embodiments, the nanoparticles have an average diameter of at least 3 nm to and including 100 nm. The nanoparticles can be in the form of clusters. The shape of the nanoparticles is not limited and includes nanospheres, nanorods, and nanocups. Nanoparticles composed of electrically semi-conductive materials can also be known as quantum dots if the particles are small enough (usually less than 30 nm) that quantization of electronic energy levels occurs. Electrically conductive semi-conductive materials include light-emitting quantum dots. The print materials include but are not limited to, semi-solid nanoparticles such as liposomes, soft nanoparticles, nanocrystals, and hybrid structures, such as core-shell nanoparticles. Moreover, the print materials also include nanoparticles of carbon such as carbon black, carbon nanotubes, electrically conducting carbon nanotubes, graphene, carbon black conducting polymers, and electrically semi-conducting nanotubes. Metal nanoparticles and dispersions of gold, silver, and copper are also useful in this invention.

In many exemplary embodiments, the printable material composition used in this invention includes a print material that is selected from the group consisting of electrically conductive materials, semi-conductive materials, dielectric materials, small molecule materials, polymeric materials, bio-based materials, electro luminescence materials, and combinations thereof.

More particularly, the printable material composition used in this invention includes a print material that contains nanoparticles of an electrically conductive material selected from the group consisting of silver or silver precursor, gold, copper, palladium, indium-tin oxide, or combinations thereof. For example, in some very useful embodiments, the printable material composition includes a print material that contains nanoparticles of an inorganic or organic silver salt such as a silver halide, silver behenate, and other silver salts that would be readily apparent to one skilled in the art.

In general, one or more print materials can be dispersed, dissolved, or suspended in a suitable carrier liquid, forming a printable material composition for application to a substrate using the flexographic printing plate described herein. The carrier liquid used for the printable material composition is not limited and can include organic compounds and aqueous compounds. For example, the carrier liquid can be an organic compound that is an alcohol-based compound. The carrier liquid can be a solvent that is capable of dissolving another substance such as one or more print materials to form a uniform solution, or it can be a compound capable of dispersing or suspending the print material in solution sufficient to carry out the method of this invention.

The carrier liquid can also include one or more compounds as a solvent for the print material. For example, the carrier liquid can include one or more solvents for the print material. In other embodiments, the carrier liquid comprises two or more solvents, for example a co-solvent mixture, for the print material. The solvent mixtures can be chosen using various criteria such as the evaporation rate (volatility) of the individual solvents, and the solvating power of the individual solvent components for a particular print material. Further details of such solvents are provided in U.S. Patent Application Publication 2008/0233280, which is incorporated herein by reference.

Representative useful carrier liquid solvents include but are not limited to, alcohols (such as isopropyl alcohol, 2-ethyl hexanol, and α-terpenol), acetates (such as ethyl acetate), water, hydrocarbons (such as toluene and cyclohexane), and combinations of miscible solvents.

In general, the printable material composition or "ink" comprising the carrier liquid and print material has a viscosity of at least 10 cps and up to and including 1500 cps, or typically of at least 200 cps and up to and including 900 cps, or up to and including 1000 cps. Some highly viscous printable material compositions can be used in the practice of this invention, and have a viscosity of at least 1500 cps up to and including 5000 cps. Viscosity can be measured using a conventional means and equipment such as a Brookfield Viscometer DV-II+ Pro (available from Brookfield Engineering Laboratories).

In some cases, it may be necessary to treat the ink with a post-processing operation, such as sintering at an elevated temperature or exposure hydrochloric acid fumes, in order to improve (or achieve) conductivity. In other embodiments, exposure to high intensity light may be used to convert a non-conductive printed ink pattern into a conductive pattern.

As mentioned earlier, the flexographic printing system 100 (FIG. 1) can also be used to print other types of active print features including semiconductor features or insulator features. Such features can perform electrical functions that will be well-known to those skilled in the art. Examples of ink that can provide semiconductor properties would include inks with semiconducting polymers such as those available from BASF. Examples of ink that can provide insulator features would include a UV curable ink such as the protective coating solutions described in U.S. Patent Application Publication 2014/0327452.

Exemplary substrates that can be used in accordance with the invention are described in the aforementioned U.S. Pat. No. 9,315,062. Suitable substrates include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include indium-tin oxide coated glass, indium-tin oxide coated polymeric films, poly(ethylene terephthalate) films, poly(ethylene naphthalate) films, polyimide films, polycarbonate films, polyacrylate films, polystyrene films, polyolefin films, polyamide films, silicon, metal foils, cellulosic papers or resin-coated or glass-coated papers, glass or glass-containing composites, ceramics, metals such as aluminum, tin, and copper, and metalized films. The substrate can also include one or more charge injection layers, charge transporting layers, and semi-conducting layers on which the printable material composition pattern is formed.

Particularly useful substrates are polyesters films such as poly(ethylene terephthalate), polycarbonate, or poly(vinylidene chloride) films that have been surface-treated, or coated with one or more suitable adhesive or subbing layers, the outer layer being receptive to the ink. Useful outer layers can be a vinylidene chloride polymer containing layer or a glycidyl methacrylate-butylacrylate co-polymer.

A surface of the substrates can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. Nos. 5,492,730 and 5,527,562 and U.S. Patent Application Publication 2009/0076217, to make the surface more receptive to the ink.

Useful substrates can have a desired thickness depending upon the eventual use of the printed electrical device, for example its incorporation into various articles or devices (for example optical devices or optical panels). The thickness of the substrate can be 4 microns to 250 microns, preferably 25 to 125 microns, and more preferably 38 to 75 microns.

The substrate can be opaque, translucent, or transparent. For applications requiring transparency, substrates can have a light transmission of 70% or greater, preferably 75% or greater, and more preferably 80% or greater.

Exemplary flexographic printing plates useful in the practice of this invention are described in the aforementioned U.S. Pat. No. 9,315,062, and can be comprised of one or more elastomeric layers, with or without a substrate, in which a relief image can be generated using suitable imaging means. For example, the relief layer comprising a relief pattern can be disposed on a suitable substrate.

For example, the elastomeric relief element (for example, flexographic printing plate) having a relief layer comprising an uppermost relief surface and an average relief image depth (pattern height) of at least 50 microns, or typically having an average relief image depth of at least 100 microns relative from the uppermost relief surface, can be prepared from image-wise exposure of an elastomeric photopolymerizable layer in an elastomeric relief element precursor such as a flexographic printing member precursor, for example as described in U.S. Pat. Nos. 7,799,504 and 8,142,987 and U.S. Patent Application Publication 2012/0237871, which are incorporated herein by reference. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted in the aforementioned U.S. Pat. No. 8,142,987. Other useful materials and image formation methods (including development) for provide elastomeric relief images are also described in the noted Ali et al. patent.

In other embodiments, the elastomeric relief element is provided from a direct (or ablation) laser-engraveable elastomer relief element precursor, with or without integral masks, as described for example in U.S. Pat. Nos. 5,719,009, 5,798,202, 5,804,353, 6,090,529, 6,159,659, 6,511,784, 7,811,744, 7,947,426, 8,114,572, 8,153,347, 8,187,793, and U.S. Patent Application Publication 2002/0136969, U.S. Patent Application Publication 2003/0129530, U.S. Patent Application Publication 2003/0136285, U.S. Patent Application Publication 2003/0180636, and U.S. Patent Application Publication 2012/0240802, each of which is incorporated herein by reference.

However the relief image is provided, its elastomeric relief layer is designed such that the elastomeric relief element has a modulus of elasticity of at least two megaPascals but less than ten megaPascals, or typically of at least four megaPascals and up to and including eight megaPascals, as determined for example, using a Digital Durometer HPE-II Series (available from Qualitest USA LC), Instron Model 5942 Single Column Table Top Materials Testing System, Texture Technologies TA-XT2i Benchtop Materials Tester, or Rheometrics Solids Analyzer Model RSAII DMA, particularly when the elastomeric relief element is a flexographic printing member.

As noted above, average relief image depth (relief pattern) or an average relief pattern height in the relief pattern is at least 50 microns or typically at least 100 microns relative to the uppermost relief surface. A maximum relief image depth (relief pattern) or relief pattern height can be as great as 1,000 microns, or typically up to and including 750 microns, relative to the uppermost relief surface. The relief image depth is preferably between 100 microns and 500 microns, more preferably between 150 microns and 350 microns. The relief pattern generally has a shoulder angle of greater than 25° and up to and including 85°, or typically at least 50° and up to but less than 75°, relative to a vertical line from the lowest recess to the uppermost relief surface (that is, the higher should angle of 85° would be closer to the horizontal dimension parallel with the uppermost relief surface). Shoulder angle can be measured as described in FIG. 4 of U.S. Pat. No. 7,799,504, the disclosure of which is incorporated herein by reference for details of this measurement.

By way of example, the images shown in FIG. 11 were produced in accordance with the materials and procedures outlined above and is provided to illustrate the practice of this invention and is not meant to be limiting in any manner. A flexographic printing plate precursor prepared as described in U.S. Pat. No. 8,142,987 (noted above), specifically a Flexcel™ NX flexographic printing plate precursor having a 1.14 mm total thickness, was imaged to provide a relief pattern in a flexographic printing plate as an elastomeric relief element, using a high-resolution imaging device. The flexographic printing plate had an average relief image depth of 250 microns. A detailed description of the preparation of flexographic plates is included in U.S. Pat. No. 8,399,177, the disclosure of which is incorporated herein by reference. In the preparation of flexographic plates, it may also be useful to employ a double-sided UV exposure to cross-link the polymer on both sides of the plate material as described in U.S. Patent Application Publication 2014/0047992, which is incorporated herein by reference.

Each elastomeric relief element was then mounted using an adhesive-backed tape onto the plate cylinder of a flexographic press and printed using a catalyst ink. These samples were subsequently plated with copper via an electroless copper plating solution.

The invention has been described in detail with particular reference to certain preferred embodiments thereof, but it will be understood that variations and modifications can be effected within the spirit and scope of the invention.

PARTS LIST 100 flexographic printing system
102 supply roll
104 take-up roll
105 process direction
106 roller
107 roller
110 print module
111 plate cylinder
112 flexographic printing plate
113 raised features 114 impression cylinder
115 anilox roller
116 UV curing station
120 print module
121 plate cylinder
122 flexographic printing plate
124 impression cylinder
125 anilox roller
126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first side
152 second side
200 electroless plating system
202 supply roll
204 take-up roll
205 in-track direction
206 drive roller
207 drive roller
208 web-guiding roller
210 plating solution
215 replenished plating solution
220 reservoir
230 tank
232 drain pipe
234 return pipe
236 filter
240 pump
242 controller
250 web of media
251 first surface
252 second surface
300 anilox roller
310 cylinder
320 roller mount
330 ceramic coating
340 cell
345 cell size
350 wall
355 thickness
360 close-up view
370 cross-sectional view
380 anilox roller pattern
410 feature
411 feature
415 feature
416 feature
420 feature
425 feature
427 set of features
450 flexographic printing plate
451 flexographic printing plate
460 feature
461 feature
465 feature
466 feature
470 printing surface
471 shoulder
476 shoulder
500 apparatus
510 touch screen
520 display device
530 touch sensor
540 transparent substrate
541 first side
542 second side
550 conductive pattern
551 fine lines
552 grid
553 fine lines
554 channel pads
555 grid column
556 bus lines
558 connector pads
560 conductive pattern
561 fine lines
562 grid
563 fine lines
564 channel pads
565 grid row
566 bus lines
568 connector pads
580 controller
602 enlarged portion
604 enlarged portion
606 enlarged portion
610 cross-track direction
612 in-track direction
615 outermost trace
616 outermost trace
617 outermost trace
620 ground shield
700 traces
705 outermost trace
707 outermost trace
710 active region
720 protective feature
725 protective feature
730 inactive region
735 inactive region
740 other feature
745 bend
750 pattern of features

The invention claimed is:

1. A method for forming a printed electrical device using a flexographic printing system, comprising:

providing a flexographic printing plate including a pattern of raised features for transferring ink from an anilox roller to a substrate, wherein the flexographic printing plate includes:

an active region wherein the pattern of raised features includes a plurality of traces that follow substantially parallel paths which print a corresponding pattern of active print features that are used to form active micro-traces that provide an electrical function in the printed electrical device, wherein adjacent traces in the plurality of traces are separated by a trace spacing; and an inactive region adjacent to the active region wherein the pattern of raised features includes one or more protective features which print a corresponding pattern of protective print features that are used to form features that are electrically inactive in the printed electrical device, wherein the one or more protective features are separated from an outermost trace of the plurality of traces by a gap distance, the gap distance being between 60% and 250% of the trace spacing; and using the flexographic printing plate in the flexographic printing system to transfer ink from the anilox roller to the substrate to provide a printed pattern corresponding to the pattern of raised features on the flexographic printing plate.

2. The method of claim 1, wherein the one or more protective features include a trace that is substantially parallel to the outermost trace.

3. The method of claim 1, wherein the one or more protective features include one or more line segments.

4. The method of claim 3, wherein the one or more line segments are substantially parallel to the outermost trace.

5. The method of claim 1, wherein the one or more protective features include one or more isolated dots.

6. The method of claim 1, wherein the outermost trace includes a bend where the outermost trace changes direction, and wherein one or more of the protective features are positioned in proximity to the bend.

7. The method of claim 1, wherein the trace spacing is between 3 microns and 40 microns.

8. The method of claim 1, wherein the raised features have printing surfaces, and wherein the printing surfaces of the traces have a trace width of between 1 micron and 30 microns.

9. The method of claim 8, wherein the anilox roller includes cells having a cell size, and wherein the trace width is less than 200% of the cell size.

10. The method of claim 1, wherein the active micro-traces are conductive micro-wires.

11. The method of claim 10, wherein the ink is a catalytic ink, and further including using an electroless plating process to plate a conductive material onto the catalytic ink of the printed pattern to provide a conductive pattern, wherein the conductive material plated onto the pattern of active print features form corresponding conductive micro-wires.

12. The method of claim 10, wherein the ink is a conductive ink such that the pattern of active print features in the printed pattern form corresponding conductive micro-wires.

13. The method of claim 1, wherein the ink has semiconductor properties or insulator properties.

14. The method of claim 1, wherein the plurality of traces are substantially parallel to a nip between the anilox roller and the flexographic printing plate.

15. The method of claim 14, wherein the substrate moves through the flexographic printing system from upstream to downstream, and wherein the protective print features are printed on the substrate downstream of the pattern of active print features.

16. The method of claim 1, wherein the plurality of traces are substantially perpendicular to a nip between the anilox roller and the flexographic printing plate.

17. The method of claim 16, wherein the flexographic printing plate further including two additional raised features located in proximity to the outermost trace, and wherein the protective features are located along the outermost trace laterally in between the two additional raised features.

18. The method of claim 1, wherein the micro-traces formed by the pattern of active print features are electrical bus lines.

19. The method of claim 1, wherein the one or more protective features are separated from any other raised features besides the plurality of traces by a distance of at least 200% of the trace spacing.

20. The method of claim 1, wherein the inactive region is a first inactive region, and wherein the flexographic printing plate further includes a second inactive region adjacent to the active region on an opposite side of the active region from the first inactive region, wherein the pattern of raised features in the second inactive region includes one or more additional protective features which print a corresponding pattern of additional protective print features that are electrically inactive in the printed electrical device, wherein the one or more additional protective features are separated from a second outermost trace of the plurality of traces by a gap distance, the gap distance being between 60% and 250% of the trace spacing.

* * * * *